(12) United States Patent
Fowler et al.

(10) Patent No.: US 8,735,863 B2
(45) Date of Patent: May 27, 2014

(54) INTEGRATED NONVOLATILE RESISTIVE MEMORY ELEMENTS

(75) Inventors: Burt Fowler, Buda, TX (US); Glenn Mortland, Austin, TX (US)

(73) Assignee: Privatran, Austin, TX (US)

( * ) Notice: Subject to any disclaimer, the term of this patent is extended or adjusted under 35 U.S.C. 154(b) by 0 days.

(21) Appl. No.: 13/356,237

(22) Filed: Jan. 23, 2012

(65) Prior Publication Data

US 2013/0075683 A1    Mar. 28, 2013

Related U.S. Application Data

(60) Provisional application No. 61/437,065, filed on Jan. 28, 2011.

(51) Int. Cl.
   *H01L 21/02*    (2006.01)
(52) U.S. Cl.
   USPC .......... 257/4; 257/2; 257/5; 257/E21.409; 257/E29.309; 257/E45.002
(58) Field of Classification Search
   USPC ............. 257/2, 4, 9, 27.015, 29.309, 45.002
   See application file for complete search history.

(56) References Cited

U.S. PATENT DOCUMENTS

| | | | |
|---|---|---|---|
| 7,781,230 B2* | 8/2010 | Odagawa et al. | 438/3 |
| 2006/0073642 A1* | 4/2006 | Yeh et al. | 438/132 |
| 2006/0175596 A1* | 8/2006 | Happ et al. | 257/2 |
| 2007/0159868 A1 | 7/2007 | Sugita et al. | |
| 2008/0017842 A1* | 1/2008 | Happ et al. | 257/4 |
| 2009/0101883 A1* | 4/2009 | Lai et al. | 257/3 |
| 2009/0298223 A1* | 12/2009 | Cheek et al. | 438/102 |
| 2010/0155722 A1 | 6/2010 | Meyer | |
| 2010/0157657 A1 | 6/2010 | Rinerson et al. | |
| 2010/0207095 A1* | 8/2010 | Lai et al. | 257/4 |
| 2010/0219498 A1 | 9/2010 | Shimizu | |
| 2010/0238702 A1* | 9/2010 | Yamaguchi et al. | 365/148 |
| 2010/0264397 A1* | 10/2010 | Xia et al. | 257/4 |
| 2011/0038196 A1 | 2/2011 | Tour et al. | |
| 2011/0080774 A1* | 4/2011 | Saito et al. | 365/163 |

OTHER PUBLICATIONS

International Searching Authority, International Search Report and Written Opinion for PCT/US2011/050812, Sep. 8, 2011.
International Bureau, International Preliminary Report on Patentability for PCT/US2011/050812, Sep. 8, 2011.
International Searching Authority, International Search Report and Written Opinion for PCT/US2012/052450, Aug. 27, 2012.
Yao, Jun et al, "Resistive Switches and Memories from Silicon Oxide," Nano Lett 2010 10, Aug. 31, 2010, pp. 4105-4110.
Sawa, Akihito, "Resistive Switching in Transition Metal Oxides" Materials Today, Jun. 2008, vol. 11, No. 6, pp. 28-36.
M. Dong and L. Zhong, "Challenges to crossbar integration of nanoscale two-terminal symmetric memory devices," in Proc. IEEE Int. Conf. Nanotechnology, (2008).

(Continued)

*Primary Examiner* — Michael Lebentritt
(74) *Attorney, Agent, or Firm* — Winstead PC

(57) ABSTRACT

A resistive memory apparatus provides resistive memory material between conductive traces on a substrate or in a film stack on a substrate. The resistive memory apparatus may provide a sealed cavity or may utilize material obviating the need for the cavity. Methods and materials utilized to form the resistive memory apparatus are compatible with current microelectronic fabrication techniques. The resistive memory apparatus is nonvolatile or requires no power to maintain a programmed state. The resistive memory device may also be directly integrated with other microelectronic components.

28 Claims, 9 Drawing Sheets

(56) References Cited

OTHER PUBLICATIONS

J. Yao, L. Zhong, D. Natelson, and J. M. Tour, "Etching-dependent reproducible memory switching in vertical SiO2 structures", Appl. Phys. Lett. 93, 253101 (2008).

J. Yao, L. Zhong, Z. Zhang, T. He, Z. Jin, D. Natelson, and J. M. Tour, "Resistive switching in nanogap systems on SiO2 substrates", Small, 5, 2910-2915 (2009).

E. Linn, et al. "Complementary resistive switches for passive nanocrossbar memories", Nat. Mat. 9, 403-406 (2010).

J. Yao, L. Zhong, D. Natelson, and J. M. Tour, "Making memory out of silicon oxide filaments", EE Times Europe, Dec. 2010, p. 11.

J. Yao, L. Zhong, D. Natelson, and J. M. Tour, "Intrinsic resistive switching and memory effects in silicon oxide", Appl. Phys. A 102, 835-839 (2011).

J. J. Yang, F. Miao, M. D. Pickett, D. A. A. Ohlberg, D. R. Stewart, C. N. Lau and R. S. Williams, "The mechanism of electroforming of metal oxide memristive switches," Nanotechnology 20 (2009) 215201.

M-H Lin, M-C Wu, C-H Lin and T-Y Tseng, "Effects of Vanadium Doping on Resistive Switching Characteristics and Mechanisms of SrZrO3-Based Memory Films", IEEE Tran Elect Dev 57-8 pp. 1801-1808 (2010).

* cited by examiner

INTEGRATED NONVOLATILE RESISTIVE MEMORY ELEMENTS

RELATED APPLICATIONS

This application claims the benefit of U.S. Provisional Patent Application No. 61/437,065 to Burt Fowler, filed on Jan. 28, 2011.

STATEMENT REGARDING FEDERALLY SPONSORED RESEARCH

This invention was made with government support under Grant No. N00039-10-C-0056 awarded by the U.S. Department of Defense. The government has certain rights in the invention.

FIELD OF THE INVENTION

This invention relates to a resistive memory device. More particularly, to various arrangement for a resistive memory devices and methods for forming such resistive memory devices.

BACKGROUND OF INVENTION

A memresistor is an electronic device that can change conductivity. For example, a memresistor may provide a high conductivity state when a first voltage is applied to the memresistor, and the memresistor may provide a low conductivity state when a second voltage is applied to the memresistor.

A memresistor may be utilized in a variety of electronic applications such as, but not limited to, nonvolatile storage. Additionally, a memresistor may be integrated with other electronic components such as, but not limited to, diodes, transistors, or other electronic components.

SUMMARY OF THE INVENTION

In one implementation, a resistive memory apparatus includes a substrate and a first electrode formed in a portion of the substrate, wherein the portion of the substrate is doped to form a first doping type area. The apparatus also includes a resistive memory layer positioned over at least a portion of the first electrode, wherein the resistive memory layer provides a low resistivity state when a first predetermined voltage range is applied, and the resistive memory layer provides a high resistivity state when a second predetermined voltage range is applied. A second electrode is positioned over at least a portion of the resistive memory layer, wherein the second electrode is formed from a conductive layer. A first trace is coupled to the first electrode, and a second trace is coupled to the second electrode.

In another implementation, a method for forming a resistive memory device includes the steps of doping a portion of a substrate to form a first electrode, wherein the portion of the substrate is doped to a first doping type, and depositing a first insulator layer on the substrate, wherein the first insulator layer is positioned over at least a portion of the first electrode. The method also includes depositing a conductive layer to form a second electrode positioned over at least a portion of the resistive memory layer, and creating a second insulator layer on at least the first and second electrodes. A first trace is deposited to couple the first trace to the first electrode, and a second trace is deposited to couple the second trace to the second electrode. Electroforming is performed across the first trace and the second trace to form a resistive memory material in the first insulator layer, wherein the resistive memory material provides a low resistivity state when a first predetermined voltage range is applied, and the resistive memory material provides a high resistivity state when a second predetermined voltage range is applied.

In some implementations, a resistive memory apparatus may be directly integrated with microelectronic component(s), such as, but not limited to, diodes, resistors, capacitors, photodiodes, transistors, or the like.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

The foregoing has outlined rather broadly various features of the present disclosure in order that the detailed description that follows may be better understood. Additional features and advantages of the disclosure will be described hereinafter.

DETAILED DESCRIPTION

Figure 1:
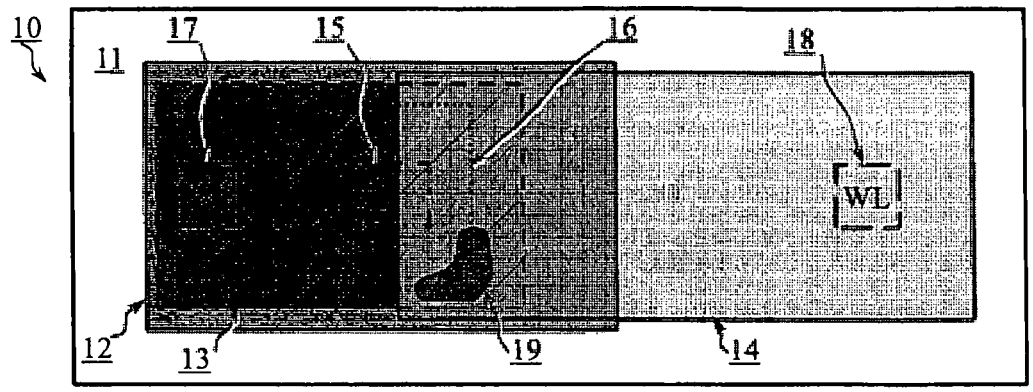
FIG. 1 is an illustrative implementation of a top down view of a memresistor cell having a bit line BL and a word line WL.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

A memresistor or resistive memory is an electronic device that can change conductivity. For example, a memresistor may provide a high conductivity state when a first voltage is applied to the memresistor, and the memresistor may provide a low conductivity state when a second voltage is applied to the memresistor.

A memresistor may be utilized in a variety of electronic applications such as, but not limited to, nonvolatile storage. Additionally, a memresistor may be integrated with other electronic components such as, but not limited to, diodes, transistors, or other electronic components.

A resistive memory apparatus and method for forming the resistive memory apparatus is discussed herein. A resistive memory apparatus may be utilized as a nonvolatile memory cell. For example, the resistive memory apparatus may be formed using a first electrode in the substrate, a deposited or thermally-grown resistive memory material, a second electrode, and orthogonal word and bit lines connected to the two electrodes. The resistive memory apparatus may be integrated directly with an electronic component such as, but not limited to, a diode or transistor by forming one terminal of the memresistor cell in the same physical region as one terminal of the diode or transistor. The resistive memory material may be passivated or hermetically sealed for electrical isolation and for protection from water and other contaminates present in air.

A resistive memory apparatus may include resistive memory material between overlaying conductive traces on a substrate or in a film stack on a substrate. In one implementation, the upper conductive trace is doped poly-silicon, the lower conductive trace is doped single-crystal silicon and the resistive memory material is silicon oxide. Other implementations may utilize a variety of suitable materials. For example, other implementations may use doped silicon oxide or layered silicon oxide/doped silicon oxide thin film structures as the resistive memory material to modify the unipolar current-voltage response. A resistive memory apparatus may provide a high density resistive memory, may be integrated with other electronic components, may be passivated to electrically-isolated memresistor cells, or a combination thereof. Additionally, various methods of forming resistive memory apparatuses are discussed herein.

A resistive memory apparatus may provide phase change memory materials. The memory device may provide at least one memresistor cell and may also provide high integration density configurations to form arrays of memresistor cells. Resistive memory apparatuses and methods of forming resistive memories, the interconnection of resistive memory cells to form memresistor arrays, and the incorporation of electronic components with resistive memories are discussed herein.

In an illustrative implementation, a memresistor cell may be formed on a deposited silicon dioxide insulator layer covering portions of a silicon substrate. The silicon substrate can have active electronic components in the silicon substrate including, but not limited to, diodes, bipolar transistors and field effect transistors, FET, or the like. For example, an illustrative implementation may include integration of a two-terminal resistive memory material with active electronic components in the silicon substrate to form a memresistor cell where one memresistor terminal is coincident with one terminal of the active electronic component in the silicon substrate. The memresistor cell may provide an upper word line conductive trace that overlays a lower bit line conductive trace wherein the word line conductive trace connects to first memresistor terminal and the bit line conductive trace connects to a first terminal of the active electronic component, with said active device having a second active device terminal sharing an electrical node with, and being physically coincident with, the second memresistor terminal.

Some implementations may use starting substrate materials of silicon or silicon-on-insulator, although GaAs as well as other semiconducting substrates can be used. A doped region in the silicon substrate, or in the silicon on insulator layer, comprises the lower memresistor cell electrode. A silicon oxide layer may be deposited or grown thermally over the doped silicon region, followed by deposition of a conductive material, typically a doped polysilicon layer. An opening may be made in the silicon oxide layer to form a sidewall connected to the first doped silicon electrode and the second deposited polysilicon electrode. An insulator may then be deposited to passivate the resistive memory material. The doped polysilicon layer and the doped single crystal silicon region may be contacted by etching through the passivation layer and the resistive memory material to contact the first doped silicon electrode and simultaneously etching through the passivation layer to contact the second polysilicon electrode.

Alternate resistive memory materials such as metal oxides may be used that do not require a sidewall to achieve the memresistor cell. In this case, an opening in the resistive memory material that forms the sidewall may be optional and the passivation layer may only be on the top surfaces of the resistive memory material and the second electrode material.

In some implementations, the memresistor may be integrated with a transistor. As a non-limiting example, the second electrode polysilicon layer of a memresistor can also form the gate electrode in a MOS transistor, while the resistive memory material forms the transistor gate dielectric. By making the single-crystal first memresistor electrode the same doping type as the MOS transistor source and/or drain, the memresistor terminal shares a terminal with the MOS transistor and the memresistor device is fully integrated with the MOS transistor, thereby eliminating the need to form a metal contact to the shared terminal. The integration approach is compatible with both conventional, planar MOS transistor fabrication as well as advanced, fin-FET MOS transistor fabrication.

In some implementations, the memresistor may be integrated with a diode. Integration with a diode formed in the silicon substrate may be similar to the transistor integration. As a non-limiting example, one terminal of the memresistor device is connected directly to one terminal of the diode in the substrate. In some implementations, diodes may be formed in the resistive memory material layer by using a layered structure comprised of silicon oxide layers with different doping types.

In addition to the various passivation methods described herein, a hermetic sealing method is described where an opening is formed through the entire set of interconnect dielectric layers to expose a sidewall in the resistive memory material. The etched cavity may be hermetically sealed using wafer-to-wafer bonding methods well known in the art of microfabrication such as thermo-compression bonding.

The memresistor cell structures and fabrication processes can be used in applications where a nonvolatile memory is to be integrated with microelectronic circuitry. The advantages of resistive memories or memresistor apparatuses discussed herein include providing a nonvolatile memory element with only two terminals, materials compatibility with conventional and advanced microelectronics fabrication, a memory requiring zero power to maintain a programmed state, and the ability to integrate the memresistor directly with electronic components, such as diodes, transistors, or the like.

The following steps may be performed to form a memresistor apparatus:
1) A substrate is formed with a first doped area of the substrate to form an electrode;
2) A resistive memory layer is formed over the substrate with a resistive memory material;
3) A conductive layer is deposited over the resistive memory layer. The conductive layer may be patterned to form a trace;
4) An insulator layer of insulating material is deposited or formed. The insulator layer may have a surface substantially parallel to the substrate surface;
5) Optionally, an opening(s) may be formed through the resistive memory layer, conductive layer, and/or insulator layer. Note that the use of certain resistive memory materials, such as metal oxide resistive memory materials, may obviate the need to form a sidewall, thereby eliminating the need for sidewall(s);
6) a trace layer of conductive material in contact with the first doped area of the substrate and the conductive layer. The trace layer may be further patterned to form bit line/word line traces that may be electrically isolated from each other;

Optional Steps:
additional layer(s) of insulating material may optionally be deposited and may have a surface substantially parallel to the substrate surface;
openings formed in the additional layer(s) of insulating material to expose the trace layer;
a second trace layer of conductive material patterned to form traces connected to the conductive material of the first trace layer.

Some resistive memory devices may require a vacuum or other low-oxygen ambient for optimal performance. Resistive memory devices may provide a cavity and/or passivation layers that hermetically seal the resistive memory material and protect it from moisture, oxygen and other contaminates.

Performance degradation in the form of high OFF-state current, and therefore low ON/OFF current ratio, has been observed if the resistive memory material is subjected to anneal in reducing ambient. CMOS fabrication processes use a forming gas anneal, such as 30 minutes at 450 C, containing either hydrogen or deuterium in a balance of nitrogen for the purpose of passivating electronic trap defects at the silicon-to-silicon oxide interface in the MOS transistors. The same anneal may also be performed near the end of metal interconnect processing in microelectronic technologies to passivate charges at the metal-to-dielectric interfaces in the interconnect. The ON/OFF ratio performance degradation may be significantly reduced or eliminated by reducing the length of the vertical silicon oxide sidewall along the memresistor perimeter so that only a minimal length of sidewall remains after the resistive memory material is formed. Proper design of the photolithography mask used to form the sidewall will use a minimum sized opening located to expose the silicon oxide top surface and only a single top electrode edge. In this way the portion of the sidewall that is not electroformed into the resistive memory material will be minimized so that leakage current across the unformed portion of the sidewall will remain below the OFF-state current flowing through the resistive memory material. The forming gas anneal-induced performance degradation observed in silicon oxide resistive memory materials is not expected to occur in memresistor cells using metal oxide resistive memory materials.

The implementations discussed herein may be varied in multiple ways. Variations may include, but are not limited to:
7) Doped silicon oxide materials used to modify the unipolar current-voltage response;
8) Layered resistive memory materials comprised of doped silicon oxide materials with a different doping type can be used to form a diode within the resistive memory material thin film stack;
9) Metal oxide resistive memory materials eliminate the need to form a sidewall, will be robust with respect to forming gas anneal, and will exhibit a bipolar current-voltage response;
10) Porous silicon oxide resistive memory materials will eliminate the need to form a sidewall;
11) Using a metal with a Schottky interface to the resistive memory material instead of polysilicon as the top electrode will enable a diode to be formed at the top electrode/resistive memory material interface;
12) Passivation layers can be used to seal a recess containing the resistive memory material; and/or
13) Wafer bonding can be used to hermetically seal a cavity containing the resistive memory material.

Resistive memory apparatuses discussed herein may provide phase change memory materials utilized in a memory device. The memory device has at least one memresistor cell, and high integration density configurations have arrays of memresistor cells. Methods of forming memresistor memory cells, the interconnection of cells to form memresistor arrays, and devices incorporating memresistor cells are discussed herein.

In some implementations of a resistive memory apparatus, a memresistor cell may be formed on a deposited silicon dioxide insulator layer covering portions of a silicon substrate. The silicon substrate can have electronic components included in the silicon substrate, such as diodes, bipolar transistors and field effect transistors, FET, and/or the like. Implementations may include integration of a two-terminal resistive memory material with electronic components in the silicon substrate to form a memresistor cell, wherein one memresistor terminal is coincident with one terminal of the active device in the silicon substrate. In some implementations, the memresistor cell may have an upper word line conductive trace that overlays a lower bit line conductive trace, wherein the word line conductive trace connects to a first memresistor terminal and the bit line conductive trace connects to a first terminal of the electronic component, with said electronic component having a second active device terminal sharing an electrical node with, and being physically coincident with, the second memresistor terminal.

FIG. 1 is an illustrative implementation of a top down view of a memresistor cell 10 having a bit line BL and a word line WL. Region 15 represents where resistive memory material 15 is formed between doped single crystal Si bottom electrode 13 and doped poly-silicon top electrode 14. Substrate 11 may be an un-doped or lightly-doped silicon wafer or a silicon-on-insulator (SOI) substrate comprised of a single crystal silicon layer on a buried oxide (BOX) layer on a silicon wafer. Single-crystal Si trace 12 is formed on substrate 11, followed by doping Si trace 12 through opening 13. A first insulator layer of silicon oxide and a poly-silicon layer are deposited, and the poly-silicon layer is doped and patterned to form top poly-silicon electrode 14. A region 15 providing resistive memory material defines the active memresistor region and represents an opening where the first insulator layer is removed to form a sidewall connecting doped single-crystal Si bottom electrode 13 to doped poly-silicon top electrode 14. It is within the first insulator sidewall where the memresistor device is formed. The opening of region 15 can be located at any overlap of the poly-silicon electrode 14 edge and the underlying Si electrode 13. Poly-silicon electrode 14 acts as a hardmask during the first insulator etch so that electrode 14 is undercut when an isotropic etchant is used for the first insulator etch to form sidewall 16 where electrode 14 overlays the removed portion of the first insulator. A second dielectric layer may then be deposited to electrically passivate top electrode 14 and bottom electrode 13. Opening 17 is patterned in the first insulator and opening 18 is simultaneously patterned in the second insulator. Thermal anneal in ambients including, but not limited to, vacuum, Ar, $N_2$, $O_2$, $H_2O$ and $H_2/N_2$ may be used to condition sidewall 16 for later electroforming processes, with anneal temperature limited only by the silicon and silicon oxide materials system present at this point in the fabrication sequence. A series of electroformation voltage waveforms, each comprised of linear voltage ramps or voltage pulses to maximum voltages in the range from 5 to 40V, are applied across sidewall 16 by making electrical contact to electrode 13 through opening 17 and electrode 14 through opening 18. During the electroforming process, a portion of sidewall 16 may undergo a volume expansion and other morphology changes while forming a vertical connection between doped Si electrode 13 and doped poly-silicon electrode 14. Region 19 is the active, electroformed resistive memory material with resistivity modified by applying voltage pulses across electrodes 13,14, voltage pulses being typically in the range from 1 to 20 volts with 10 nano-second to 1 milli-second pulsewidth.

Figure 2:
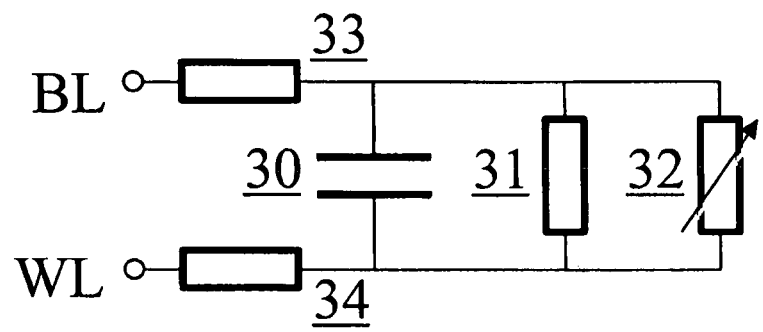
FIG. 2 is an illustrative implementation of device circuit schematic showing device capacitance and leakage resistor in parallel with memresistor of variable resistivity, and series resistance from resistive memory material to word line and bit line.

FIG. 2 is an illustrative implementation of device circuit schematic showing device capacitance and leakage resistor in parallel with memresistor of variable resistivity, and series resistance from resistive memory material to word line and bit line. Capacitor 30 accounts for the capacitance between FIG. 1 polysilicon electrode 14 and Si electrode 13, resistors 33 and 34 account for the series resistance from the resistive memory material to the word and bit line nodes, respectively, and leakage resistor 31 accounts for bulk current leakage through the first insulator and surface leakage across the portion of FIG. 1 sidewall 16 that is not included in electroformed region 19. Capacitance can be minimized by reducing the overlap of polysilicon electrode 14 and Si electrode 13. Bulk leakage through the first insulator is very small on the order of pA and can typically be neglected. If the perimeter length of the unformed portion of sidewall 16 is large compared to formed region 19, significant surface leakage current can occur so that leakage resistor 31 becomes smaller than the resistance of formed region 19 for some memresistor resistivity conditions, represented in FIG. 2 as variable resistor 32, which can limit the memresistor dynamic range, defined as the largest programmable current divided by the smallest programmable current, both measured at the same bias across bit line and word line. Current flowing through the memresistor cell being measured with a current meter connected at either the bit line or word line. Device dynamic range can therefore be maximized by making FIG. 1 opening 15 as small as possible and reducing the first insulator thickness to minimize poly-silicon electrode 14 undercut so that region 19 consumes a large fraction of sidewall 16 during electroformation. In this way the resistance of FIG. 2 leakage resistor 31 can be made much larger than the highest resistance achievable in variable resistor 32.

Figure 3:
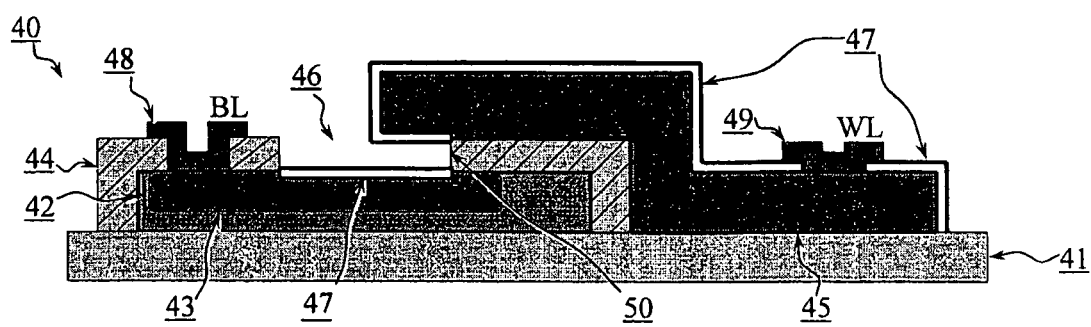
FIG. 3 is an illustrative implementation of a cross-section of a memresistor cell having passivated electrodes and conductive BL and WL traces.

FIG. 3 is an illustrative implementation of a cross-section of a memresistor cell 40 having passivated electrodes and conductive BL and WL traces. Lightly-doped or un-doped region 42 is formed on substrate 41, and bottom electrode 43 is formed by implantation or diffusion of a dopant element into layer 42. Bottom electrode 43 is made p type by using dopant elements from the group B and In, or bottom electrode 43 is made n-type by using dopant elements from the group P, As, Sb. Bottom electrode layer 43 electrically connects one side of the device formed in sidewall 50 to bit line (BL) trace 48. The substrate can be semiconducting materials other than Si, such as GaAs for example, and for these semiconductors the dopants for p and n type regions will change to those appropriate for the semiconductor used. In other embodiments, microelectronic components, such as diodes, resistors, capacitors, photodiodes, or the like, may be inserted between bit line trace 48 and bottom electrode 43 to implement a desired circuit function. A first insulating layer 44 is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials used may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, or any other suitable insulating materials. The insulating materials may be deposited using any suitable deposition methods, such as physical vapor deposition, reactive sputter deposition, low pressure chemical vapor deposition, plasma enhanced chemical vapor deposition, and/or the like. Poly-silicon may be deposited and doped, spin-coated with photoresist, lithographically patterned, and etched using $SF_6$ plasma processes to form top electrode 45. The first photoresist is removed and a next photoresist is spun on the surface and patterned to have openings over regions of the polysilicon edge where the edge overlaps doped Si region of bottom electrode 43. Plasma etching using fluorine containing gases such as $SF_6$ or HF acid wet chemical etching is done to isotropically remove the first insulator from selected regions of the bottom electrode layer 43 forming opening 46. After patterning openings in first insulator layer 44 the photoresist is removed. A second insulating layer may be grown using thermal oxidation to form passivated layer 47 on all exposed polysilicon regions of top electrode 45, and simultaneously forming a passivated layer on exposed regions of Si bottom electrode 43. This forms a thin coating of silicon dioxide only on the exposed silicon regions of bottom electrode 43 and top electrode 45 in order to passivate the device electrodes with a high-quality, silicon-to-silicon dioxide interface all the way to sidewall 50. Thermal anneal in ambients including, but not limited to, vacuum, Ar, $N_2$, $O_2$, $H_2O$ and $H_2/N_2$ may be used to condition sidewall 50 for later electroforming processes, with anneal temperature limited only by the silicon and silicon oxide materials system present at this point in the fabrication sequence. Photolithography and etch are used to form openings in the first and second insulator layers, followed by metal deposition, patterning and etch to form bit line trace 48 and word line trace 49. In the upper part of sidewall 50 where passivated layer 47 consumes top electrode 45 during the thermal oxidation, a sharp feature will form in top electrode 45. In the same way and at the same time during the thermal oxidation, a sharp feature will form in bottom electrode 43 as the result of forming passivated layer 47 so that sharp features are formed in both the top electrode 45 adjacent to the upper part of sidewall 50 and the bottom electrode 43 adjacent to the lower part of sidewall 50. Application of subsequent electroformation treatments will form the resistive memory material in the first insulator layer sidewall 50 where it contacts top and bottom electrodes 43, 45. The sharp features in top and bottom electrodes may produce high local electric fields that aid device electroformation.

The thickness of resistive material layer formed in the first insulating layer 44 may be in the range from 1 to 200 nm. Cavity 46 may be formed using an isotropic silicon oxide etch of first insulating layer 44 with polysilicon layer of bottom electrode 45 forming an etch hardmask and being undercut by the isotropic silicon oxide etch. After encapsulation of the undercut region by second insulating regions formed by passivated layer 47, the device electrodes are electrically passivated.

Figure 4:
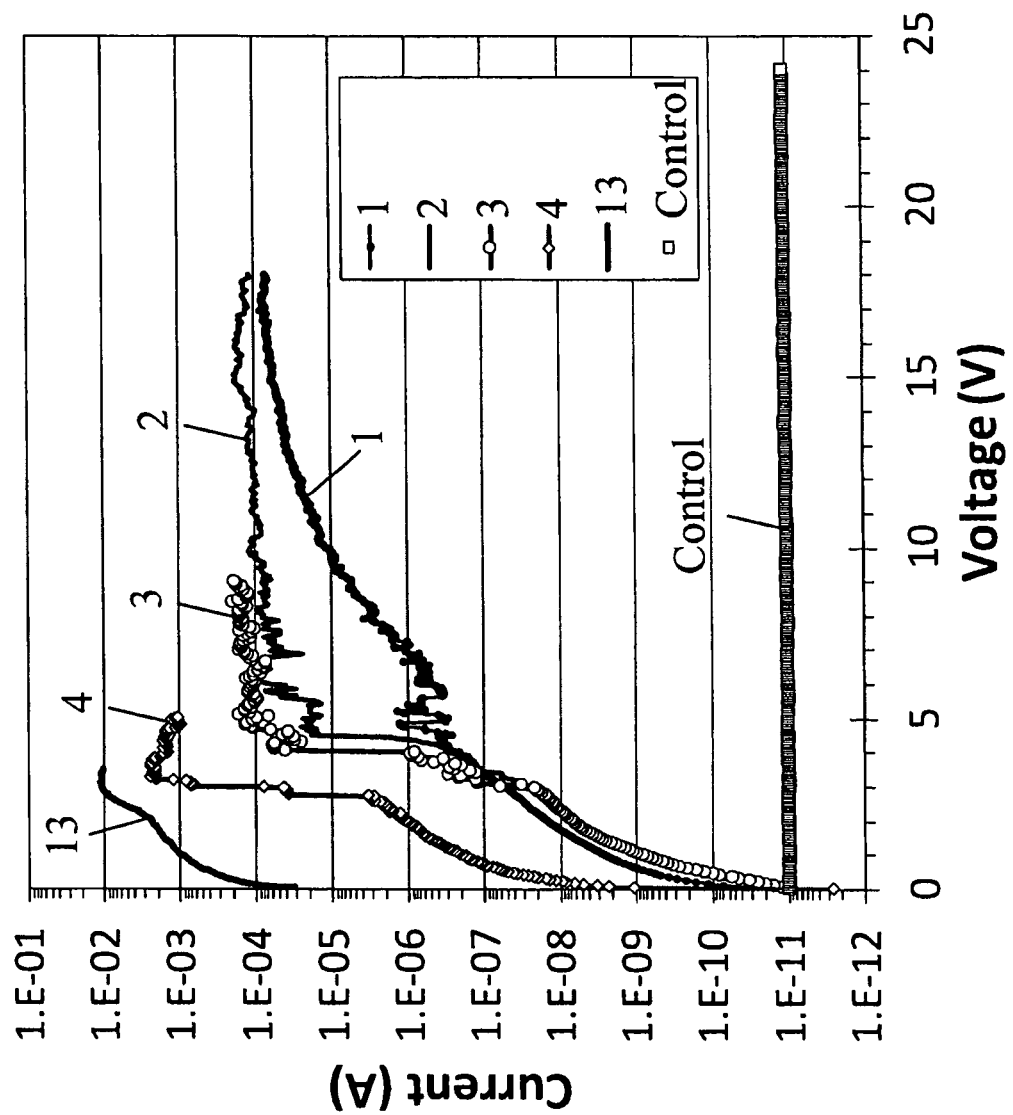
FIG. 4 is an illustrative implementation of electroforming plots with numbered curves indicating the voltage sweep order and the last curve showing the characteristic I-V response.
Figures 5A, 5B, 5C:
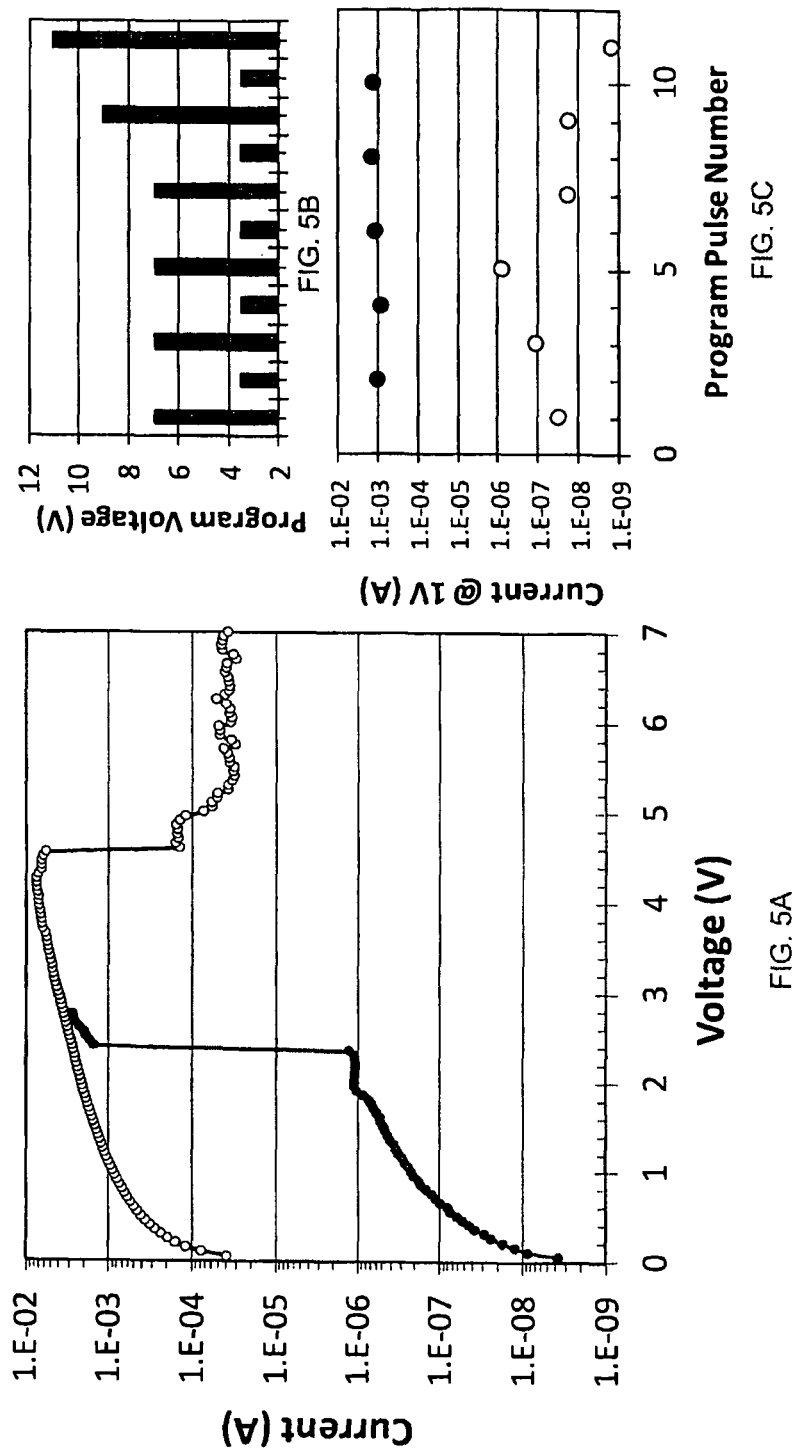
FIGS. 5A-5C are illustrative implementations of device current-voltage response and program (erase, write and read) memory cycling plots.

FIG. 4 is an illustrative implementation of electroforming plots with numbered curves indicating the voltage sweep order and the last curve showing the characteristic I-V response. Electroformation voltage waveforms comprising linear voltage ramps, such as in curves #1-3, or voltage pulses to maximum voltages in the range from 5 to 40V are applied across the device until a characteristic I-V response is achieved, such as in curve #4. Devices without a sidewall may not electroform, as indicated by the curve labeled "Control." Curve #13 represents a low-resistivity device ON state. After the one-time electroformation process, application of a suitable voltage pulse will switch the device between the low resistivity state, curve #13, and the high resistivity, OFF state, curve #4, with the device state being read by measuring the current at low bias ~1V. During the electroforming process, a volume expansion may occur in FIG. 3 sidewall 50 and be accommodated by cavity 46. FIGS. 5A-5C are illustrative implementations of device current-voltage response and program (erase, write and read) memory cycling plots. For example, in an illustrative implementation, the memresistor cell may be switched to a low resistivity state by applying a voltage pulse of 1-3 V with pulsewidth in the range from 10 ns to 1 ms, and the memresistor cell may be switched to a high resistivity state by applying a voltage pulse of 5-20 V with similar pulsewidth range. The resistive state of the memresistor cell is read by applying a low bias in the range from 0.1 to 2 V across word and bit lines, such as 1V. The bit or word line may be connected to a current measurement circuit comprised of a current sense circuit to determine whether the memresistor cell current is above a threshold current for digital memory applications, or the current measurement circuit may be comprised of a transimpedance amplifier to convert the memresistor cell current to an analog voltage for multi-state or analog memory applications.

Figure 6:
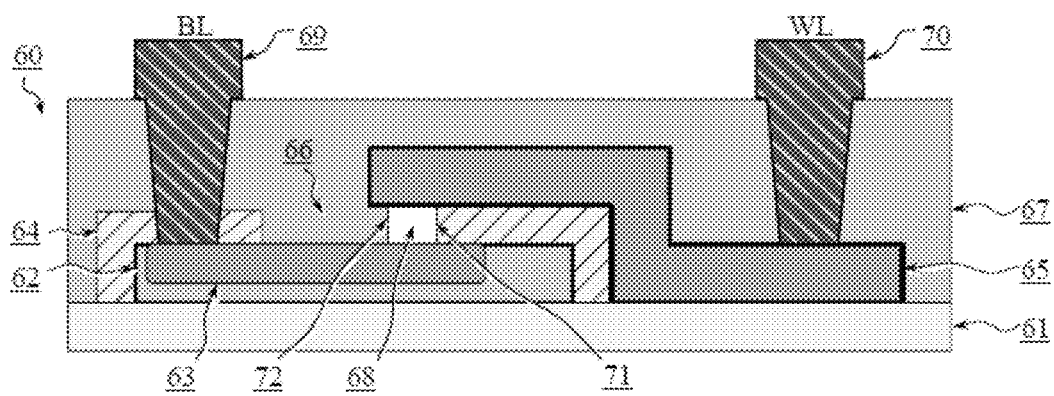
FIG. 6 is an illustrative implementation of a cross-section of a memresistor cell having an encapsulated active device region.

FIG. 6 is an illustrative implementation of a cross-section of a memresistor cell 60 having an encapsulated active device region. Lightly-doped or un-doped region 62 is formed on substrate 61, and bottom electrode 63 is formed by implantation or diffusion of a dopant element into region 62. Doped area of bottom electrode 63 is made p type by using dopant elements from the group B and In, or doped area of bottom electrode 63 is made n-type by using dopant elements from the group P, As, Sb. Bottom electrode 63 electrically connects one side of the resistive memory material formed in sidewall 71, or formed in sidewall 72, to BL trace 69. The substrate 61 can be semiconducting materials other than Si, such as GaAs for example, and for these semiconductors the dopants for p and n type regions will change to those appropriate for the semiconductor used. In other embodiments microelectronic components, such as diodes, resistors, capacitors photodiodes, transistors or the like, may be inserted between BL trace 69 and bottom electrode 63 to implement a desired circuit function. A first insulating layer 64 is deposited on the substrate electrically isolating the active element parts of the substrate 61. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, or any other suitable insulating materials. The insulating materials can be deposited using physical vapor deposition, reactive sputter deposition, low pressure chemical vapor deposition, plasma enhanced chemical vapor deposition, and/or the like. Polysilicon may be deposited and doped, spin-coated with photoresist, lithographically patterned, and etched using $SF_6$ plasma processes to form top electrode 65. The first photoresist is removed and a second photoresist is spun on the surface and patterned to have openings over regions of polysilicon electrode 65 where the edge overlaps doped Si region of bottom electrode 63. Plasma etching using fluorine containing gases such as $SF_6$ or HF acid wet chemical etching may be done to isotropically remove the first $SiO_2$ insulator from selected regions of the bottom electrode forming opening 66. After patterning openings in the first insulator layer 64 the photoresist is removed. A second insulating layer is deposited to form layer 67 covering all exposed regions except where first insulator layer 64 was removed by isotropic etch to undercut top electrode 65. Layer 67 may be deposited using plasma enhanced chemical vapor deposition with initial pressure, plasma power, and gas flow conditions tuned to deposit a highly non-conformal layer with initial thickness exceeding the thickness of layer 64, thereby forming sidewall 72 that, in conjunction with sidewall 71, form cavity 68. To form the remainder of the layer 67 thickness, the plasma enhanced chemical vapor deposition pressure, plasma power, and gas flow conditions are tuned to deposit a more conformal layer until the desired layer 67 thickness is achieved. The second insulating layer 67 is deposited on the surface and may be chemically and/or mechanically polished to make insulating layer 67 planar such that the upper surface of layer 67 is substantially parallel to the substrate. The second insulating layer 67 may be comprised of silicon dioxide, non-stoichiometric silicon oxide, phosphosilicate glass (PSG), borosilicate glass (BSG), boro-phoshosilicate glass (BPSG), $SiO_xC_yH_z$, and/or any other suitable insulator. Layer 67 may be spin-coated or deposited using physical vapor deposition, reactive sputter deposition, or using silane or tetraethyl orthosilicate (TEOS) based chemistries in a plasma enhanced chemical vapor deposition (PECVD) process, and/or the like. Those skilled in the art of microfabrication will realize that alternate insulating materials and deposition methods can be used. Thermal anneal in ambients including, but not limited to, vacuum, Ar, $N_2$, $O_2$, $H_2O$ and $H_2/N_2$ may be used to condition sidewalls 71 or 72 for later electroforming processes, with anneal temperature limited only by the silicon and silicon oxide materials system present at this point in the fabrication sequence. Chemical and/or mechanical planarization may be used to planarize layer 67 if needed for subsequent photolithography and etch processing steps to form openings in the first insulator layer 64 and layer 67, followed by metal or conductive polysilicon deposition, patterning and etch to form BL trace 69 and WL trace 70. Application of electroformation treatment can form the resistive memory material not only in the first insulator layer sidewall 71, but can also form the resistive memory material in the second insulator layer sidewall 72. The sidewall where the resistive memory material forms is determined by the electroformation threshold voltage of the two materials comprising the first and second insulator layers. If layer 67 is comprised of a material with lower electroformation threshold voltage than that of first insulator layer 64, then application of electroformation treatment will form the memresistor in the second insulator layer 67 sidewall 72. Alternatively, if layer 67 is comprised of a material with higher electroformation threshold voltage than that of first insulator layer 64, then application of electroformation treatment will form the memresistor in the first insulator layer 64 sidewall 71.

Figure 7:
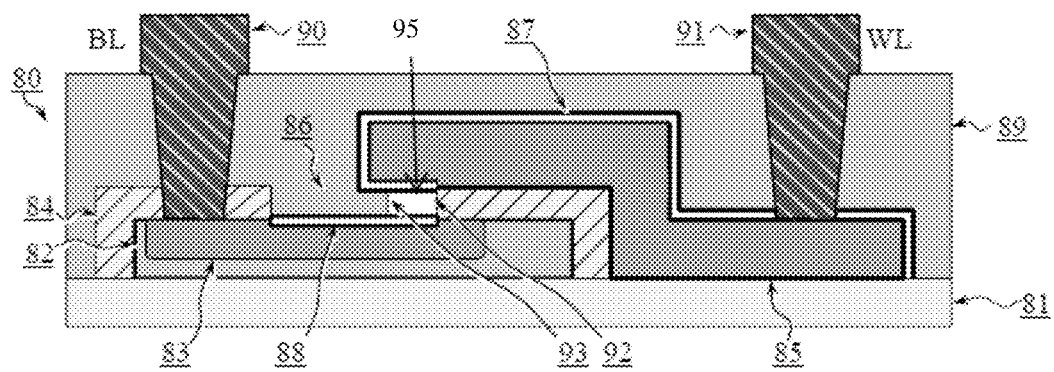
FIG. 7 is an illustrative implementation of a cross-section of a memresistor cell having a fully-passivated device with added electrical isolation.

FIG. 7 is an illustrative implementation of a cross-section of a memresistor cell 80 having a fully-passivated active device region with added electrical isolation. Lightly-doped or un-doped region 82 is formed on substrate 81, and bottom electrode 83 is formed by implantation or diffusion of a dopant element into region 82. Doped area of bottom electrode 83 is made p type which is achieved using dopant elements from the group B and In, or doped area of bottom electrode 83 is made n-type which is achieved using dopant elements from the group P, As, Sb. Bottom electrode 83 electrically connects one side of the device formed in sidewall 92, to BL trace 90. The substrate 81 can be semiconducting materials other than Si, such as GaAs for example, and for these semiconductors the dopants for p and n type regions will change to those appropriate for the semiconductor used. In some implementations, microelectronic components, such as diodes, resistors, capacitors, photodiodes, transistors, or the like, may be inserted between BL trace 90 and bottom electrode 83 to implement a desired circuit function. A first insulating layer 84 is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any suitable deposition process. In other implementations, the insulating materials may include, but are not limited to, phosphosilicate glass (PSG), borosilicate glass (BSG), borophoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, and/or any other suitable insulator. The insulating materials can be deposited using physical vapor deposition, reactive sputter deposition, low pressure chemical vapor deposition, plasma enhanced chemical vapor deposition, and/or the like. Poly-silicon is then deposited and doped, spin-coated with photoresist, lithographically patterned, and etched using $SF_6$ plasma processes to form top electrode 85. The first photoresist is removed and a next photoresist is spun on the surface and patterned to have openings over a region where the polysilicon electrode 85 edge overlaps doped Si region of bottom electrode 83. Plasma etching using fluorine containing gases such as $SF_6$ or HF acid wet chemical etching may be done to isotropically remove the first insulator layer from selected regions of the bottom electrode 83 forming opening 86. After patterning openings in the first insulator layer the photoresist is removed. A second insulating layer is grown using thermal oxidation to form layer 87 on all exposed polysilicon regions of top electrode 85 and simultaneously forming layer 88 on exposed regions of Si bottom electrode 83. This forms a thin coating of silicon dioxide only on the exposed silicon regions of bottom and top electrodes 83, 85 in order to passivate the device electrodes with a high-quality, silicon-to-silicon dioxide interface all the way to sidewall 92. The thickness and thermal oxidation growth conditions can be engineered to produce a desired mechanical stress in sidewall 92 that will aid conditioning for subsequent electroformation. Thermal anneal in ambients including, but not limited to, vacuum, Ar, $N_2$, $O_2$, $H_2O$ and $H_2/N_2$ may be used to condition sidewall 92 for later electroforming processes, with anneal temperature limited only by the silicon and silicon oxide materials system present at this point in the fabrication sequence. A third insulating layer may be deposited to form layer 89 covering all exposed regions except where first insulator layer 84 was removed by isotropic etch to undercut top electrode 85. The third insulating layer 89 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any other suitable insulating materials. The third insulating layer 89 may be spin-coated or deposited using physical vapor deposition, reactive sputter deposition, or using silane or tetraethyl orthosilicate (TEOS) based chemistries in a plasma enhanced chemical vapor deposition (PECVD) process, or any other suitable deposition process. Third insulating layer 89 may be deposited using plasma enhanced chemical vapor deposition with initial pressure, plasma power, and gas flow conditions tuned to deposit a highly non-conformal layer with initial thickness exceeding the thickness of layer 84, thereby forming sidewall 93 that, in conjunction with sidewall 92, forms a cavity 95. To form the remainder of the layer 89 thickness, the plasma enhanced chemical vapor deposition pressure, plasma power, and gas flow conditions are tuned to deposit a more conformal layer until the desired layer 89 thickness is achieved. The layer 89 is deposited on the surface and may be chemically and/or mechanically polished to make insulating layer 89 planar such that the upper surface of layer 89 is substantially parallel to the substrate. The layer 89 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any suitable insulating material. The layer 89 may be sputter-deposited, or deposited using physical vapor deposition or using silane or tetraethyl orthosilicate (TEOS) based chemistries in a plasma enhanced chemical vapor deposition (PECVD) process, and/or the like. Those skilled in the art of microfabrication will realize that alternate insulating materials and deposition methods can be used. Chemical and/or mechanical planarization may be used to planarize layer 89 if needed for subsequent photolithography and etch processing steps to form openings in the layers 84, 87, 88, 89, followed by metal or conductive polysilicon deposition, patterning and etch to form BL trace 90 and WL trace 91. Application of electroformation treatment will form the resistive memory material in the first insulator layer 84 sidewall 92 since it is in contact with both top and bottom electrodes 83, 85, but the resistive memory material will not form in the layer 89 sidewall 93 because of layers 87, 88, which electrically isolate sidewall 93 from electrodes 85 and 83, respectively. In the upper part of sidewall 92 where layer 87 consumes top electrode 85 during the thermal oxidation that forms layer 87, a sharp feature will form in top electrode 85. In the same way and at the same time during the second insulator thermal oxidation, a sharp feature will form in bottom electrode 83 as the result of forming layer 88 so that sharp features are formed in both the top electrode 85 adjacent to the upper part of sidewall 92 and the bottom electrode 83 adjacent to the lower part of sidewall 92. Application of subsequent electroformation treatments will form the resistive memory material in the first insulator layer sidewall 92 where it contacts top and bottom electrodes 83, 85.

Figure 8A:
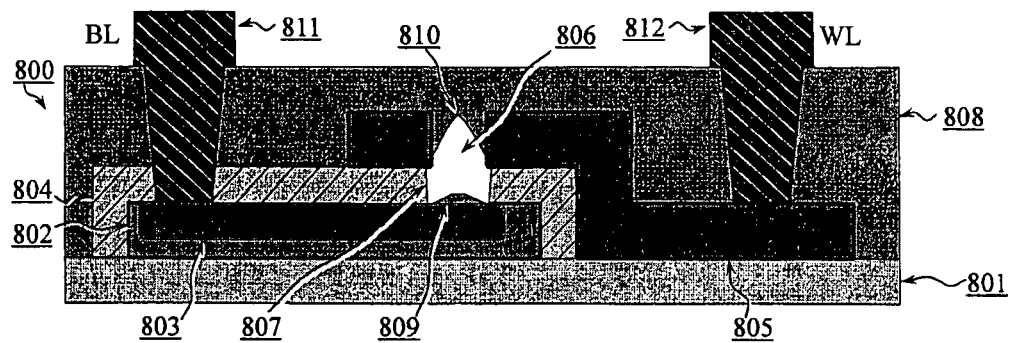
FIG. 8A-8C are illustrative implementations of cross-sections of memresistor cells having an encapsulated active device region.
Figures 8B, 8C:
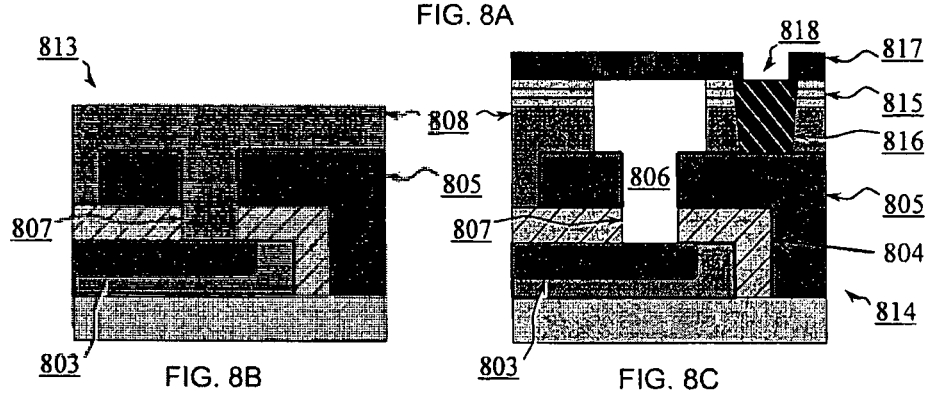

FIG. 8A-8C are illustrative implementations of cross-sections of memresistor cells having an encapsulated active device region. Opening 806 is landed entirely on top of polysilicon layer of bottom electrode 805. In cross section 800 in FIG. 8A, lightly-doped or un-doped region 802 is formed on substrate 801, and bottom electrode 803 is formed by implantation or diffusion of a dopant element into layer 802. Doped area of bottom electrode 803 is made p type by using dopant elements from the group B and In, or doped area of bottom electrode 803 is made n-type by using dopant elements from the group P, As, Sb. Bottom electrode 803 electrically connects one side of the resistive memory material formed in sidewall 807 to BL trace 811. The substrate can be semiconducting materials other than Si, such as GaAs for example, and for these semiconductors the dopants for p and n type regions will change to those appropriate for the semiconductor used. In some implementations, microelectronic components, such as diodes, resistors, capacitors, photodiodes, transistors, or the like, may be inserted between BL trace 811 and bottom electrode 803 to implement a desired circuit function. A first insulating layer 804 is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, or any other suitable insulating materials. The insulating material can be deposited using physical vapor deposition, reactive sputter deposition, low pressure chemical vapor deposition, and plasma enhanced chemical vapor deposition, and/or the like. Polysilicon is then deposited and doped, spin-coated with photoresist, lithographically patterned, and etched using $SF_6$ plasma processes to form top electrode 805. The first photoresist is removed and a second photoresist is spun on the surface and patterned to have openings only over regions of polysilicon electrode 805. Plasma etching using fluorine containing gases such as $SF_6$, $CF_4$ and $CH_xF_y$, is done to remove portions of both the polysilicon electrode 805 material and the first insulator material 804 to form opening 806 and sidewall 807. Thermal anneal in ambients including, but not limited to, vacuum, Ar, $N_2$, $O_2$, $H_2O$ and $H_2/N_2$ may be used to condition sidewall 807 for later electroforming processes, with anneal temperature limited only by the silicon and silicon oxide materials system present at this point in the fabrication sequence. After patterning openings in the polysilicon layer and first insulator layer the photoresist is removed. A second insulating layer is deposited to form layer 808. The layer 808 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any other suitable insulating material. The insulating layer may be deposited using physical vapor deposition, reactive sputter deposition, or using silane or tetraethyl orthosilicate (TEOS) based chemistries in a plasma enhanced chemical vapor deposition (PECVD) process, and/or the like. Layer 808 may be deposited using plasma enhanced chemical vapor deposition with initial pressure, plasma power, and gas flow conditions tuned to deposit material from a multitude of angles with respect to the substrate normal so that the film deposition rate near the upper part of the layer 805 sidewall is substantially larger than the film deposition rate near the lower part of the layer 805 sidewall. As the film thickness in the upper part of the layer 805 sidewall increases, region 810 is formed that encapsulates opening 806. Until region 810 is formed, some deposition can accumulate in region 809 while leaving sidewall 807 substantially un-coated by layer 808. Those skilled in the art of microfabrication will realize that alternate insulating materials and deposition methods can be used. After deposition, layer 808 is chemically and/or mechanically polished to make layer 808 planar such that the upper surface of layer 808 may be substantially parallel to the substrate as needed for subsequent photolithography and etch processing steps to form openings in the layers 804, 808, followed by deposition of a conductive layer, patterning and etch to form bit line conductive trace 811 and word line conductive trace 812. Application of electroformation treatment can form the resistive memory material in the first insulator layer sidewall 807, with opening 806 accommodating the potential expansion that may occur in sidewall 807 as the result of the electroformation treatment. Alternatively, layer 808 may be deposited using high density plasma chemical vapor deposition process where an oxide etch component exists in addition to the oxide deposition component so that opening 806 is entirely filled with layer 808 material as in FIG. 8B cross section 813. In cross section 813, sidewall 807 is coated with layer 808 and there is no significant volume to accommodate expansion. However, resistive memory material may still be electroformed at the interface of sidewall 807 and layer 808 wherein it connects top electrode 805 to bottom electrode 803. In FIG. 8C opening 806 is formed using the same photolithography steps as used to define polysilicon electrode 805. Layer 808 is deposited and fills region 806, followed by planarization, photolithography, etch, conductive layer deposition, and planarization to form bit and word line electrodes, and a last photoresist is applied to layer 808 and an opening 806 is defined so that a last etch with chemistry tuned for high oxide etch rate selectivity to Si will etch through layer 808 and first insulator layer 807, and stop on bottom and top electrodes 805, 803 as shown in FIG. 8C cross section 814. Subsequent electroformation treatments can then be applied to electroform the resistive memory material on sidewall 807. A plethora of insulator layers and a plethora of conductive layers can be formed where only the plethora of insulator layers 815 remain over region 806, and the last etch is used to remove all insulator layers 815, layer 808, and first insulator layer 804, stopping on top and bottom electrodes 805, 803. Layer 817 can be used to hermetically seal the cavity 806 formed by the last etch using silicon-to-silicon oxide wafer bonding methods, such as anodic bonding, thermo-compression bonding, and other sealing methods known in the art of microfabrication. Conductive plug 816 is formed using metal chemical mechanical planarization such that top surface of conductive plug 816 is essentially at the same height above the substrate as the top surface of layer stack 815. The top bonding wafer is thinned after being bonded to form layer 817 hermetically sealed to top layer stack 815, followed by patterning and etch of layer 817 to form electrical connection 818 to top electrode 805. Layer 817 may be etched in other regions of layer 817 to make electrical connection to other underlying circuitry.

Figure 9:
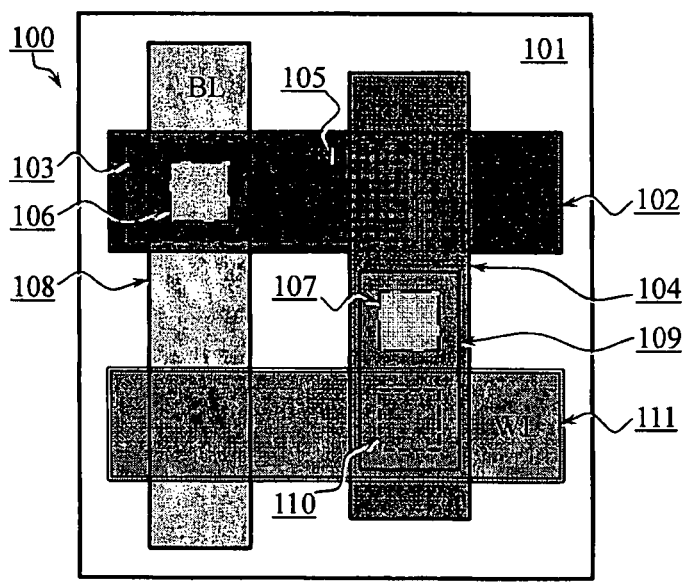
FIG. 9 is an illustrative implementation of a top-down view of a memresistor cell having orthogonal word and bit lines.

FIG. 9 is an illustrative implementation of a top-down view of a memresistor cell 100 having orthogonal word and bit lines. Area 105 represents where resistive memory material is formed between doped single crystal Si bottom electrode 103 and doped poly-silicon top electrode 104. Substrate 101 may be an un-doped or lightly-doped silicon wafer, or a silicon-on-insulator (SOI) substrate comprised of a single crystal silicon layer on a buried oxide (BOX) layer on a silicon wafer. Single-crystal Si trace 102 is formed on substrate 101, followed by doping Si trace 102 through the opening for bottom electrode 103. A first insulator layer of silicon oxide and a poly-silicon layer are deposited, and the poly-silicon layer is doped and patterned to form top electrode 104. Area 105 defines the active memresistor region and represents an opening where first insulator layer is removed to form a sidewall connecting doped single-crystal Si bottom electrode 103 to doped poly-silicon top electrode 104. It is within the silicon oxide sidewall where the memresistor device is formed, and area 105 can be located at any overlap of a poly-silicon top electrode 104 edge and underlying Si bottom electrode 103. A second insulator layer is then deposited over top electrode 104, Si bottom electrode 103 and trace 102, and exposed substrate 101. Openings 106, 107 are formed in the second insulator layer, and a first conductive layer is deposited, patterned and etched to form BL trace 108 connected through opening 106 to bottom electrode 103 and trace 109 connected through opening 107 to top electrode 104. A third insulator layer is deposited and opening 110 is formed, followed by deposition, pattern and etch of a second conductive layer to form WL trace 111 so that WL can be run orthogonal to BL trace 108. Openings 107 and 110 are shown adjacent to each other for clarity, but opening 110 can be formed directly over opening 107 if desired to reduce memresistor cell footprint. The upper conductive trace and lower conductive trace are orthogonal and are connected through vias to top electrode 104 and bottom electrode 103, respectively. The area defined by area 105 where an edge of top electrode 104 overlays bottom electrode 103 is the active portion of the memresistor cell. The lower conductive BL trace 108 is defined as the bit line (BL) and the upper conductive WL trace 111 is defined as the word line (WL). Although the bit and word lines are defined to have lower and upper positions the actual position of the bit and word lines can vary in other implementations. The resistive memory material layer has the upper surface connected to one word line trace and the lower surface connected to one bit line trace in a 2-terminal memresistor cell.

Figure 10A:
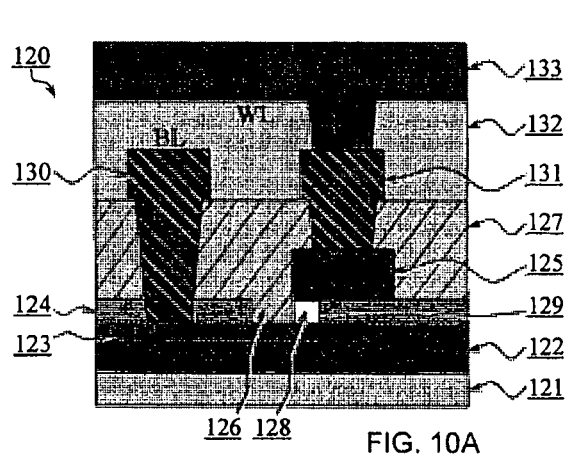
FIGS. 10A-10C are illustrative implementations of cross-sections of memresistor cells having orthogonal word and bit lines.
Figure 10B:
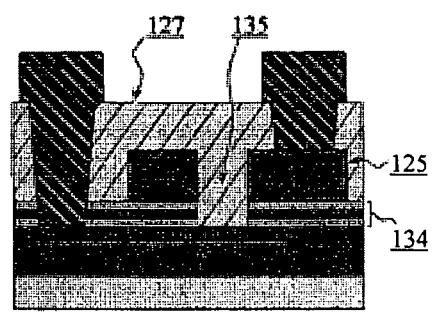
Figure 10C:
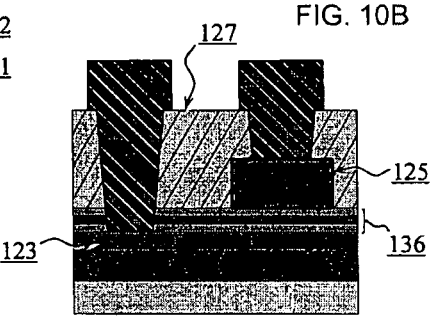

FIGS. 10A-10C are illustrative implementations of cross-sections of memresistor cells having orthogonal word and bit lines. In cross section 120 of FIG. 10A, lightly-doped or un-doped region 122 is formed on substrate 121, and bottom electrode 123 is formed by implantation or diffusion of a dopant element into layer 122. Doped area of bottom electrode 123 is made p type achieved using dopant elements from the group B and In, or doped area of bottom electrode 123 is made n type achieved using dopant elements from the group P, As, Sb. Bottom electrode 123 electrically connects one side of the device formed in sidewall 129 to BL trace 130. The substrate can be semiconducting materials other than Si, such as GaAs, and for these semiconductors the dopants for p and n type regions will change to those appropriate for the semiconductor used. In other implementations, microelectronic components, such as diodes, resistors, capacitors, photodiodes, and/or the like, may be inserted between BL trace 130 and bottom electrode 123 to implement a desired circuit function. A first insulating layer 124 is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, and/or any other suitable insulating materials. The insulating materials can be deposited using physical vapor deposition, reactive sputter deposition, low pressure chemical vapor deposition, and plasma enhanced chemical vapor deposition, and/or the like. Poly-silicon is then deposited and doped, spin-coated with photoresist, lithographically patterned, and etched using $SF_6$ plasma processes to form top electrode 125. The first photoresist is removed and a second photoresist is spun on the surface and patterned to have openings over regions of top electrode 125 polysilicon edge where the edge overlaps doped Si region 123. Plasma etching using fluorine containing gases such as $SF_6$ or HF acid wet chemical etching is done to isotropically remove portions of first insulator layer 124 from the bottom electrode 123 forming opening 126. After patterning openings in the first insulator layer the photoresist is removed. A second insulating layer 127 is deposited using plasma enhanced chemical vapor deposition, or, because only silicon and silicon oxide are present in device, other higher-temperature deposition processes, such as low pressure chemical vapor deposition (LPCVD), can be used to form layer 127. In other implementations, thermal oxidation may be performed prior to layer 127 deposition to form a thin coating of silicon dioxide only on the exposed silicon regions of top and bottom electrodes 123, 125 inside opening 126 to passivate the device electrodes with a high-quality, silicon-to-silicon dioxide interface. The second insulating layer 127 is deposited on the surface and may be chemically and/or mechanically polished to make insulating layer 127 planar such that the upper surface of layer 127 is substantially parallel to the substrate. The second insulating layer 127 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any other suitable insulating materials. The second insulating layer 127 may be spin-coated or deposited using physical vapor deposition, reactive sputter deposition, or using silane or tetraethyl orthosilicate (TEOS) based chemistries in a plasma enhanced chemical vapor deposition (PECVD) process, and/or the like. The pressure, power and gas flow parameters of the PECVD process used for second insulating layer 127 deposition are tuned to form cavity 128 in a manner so that sidewall 129 is left uncoated and there remains a sealed cavity 128 with a space between sidewall 129 and second insulating layer 127. Thermal anneal in ambients including, but not limited to, vacuum, Ar, $N_2$, $O_2$, $H_2O$ and $H_2/N_2$ may be used to condition sidewall 129 for later electroforming processes, with anneal temperature limited only by the silicon and silicon oxide materials system present at this point in the fabrication sequence. The second insulating layer 127 may have holes patterned through it and the first insulating layer using similar photolithography processes used to pattern the first insulator layer, and reactive ion etch. The plasma etch chemistry includes, but is not limited to, $CF_xH_y$ and $SF_6$ to stop the etch when the etch front reaches the poly-silicon top electrode 125 and Si bottom electrode 123 so that a high etch selectivity to Si is achieved. BL trace 130 is formed by depositing a first conductive layer on the patterned surface of the second insulation layer 127 and in the openings of first insulating layer 124 to make contact to doped single crystal Si bottom electrode 123, whereas simultaneously plug 131 may be formed making contact to poly-silicon electrode 125. Third insulating layer 132 is deposited, planarized, patterned and etched using similar methods as described above to form an opening over plug 131, and a second conductive layer is deposited, patterned and etched to form WL trace 133 orthogonal to BL trace 130.

In FIG. 10B, the resistive memory material is comprised of a single thin film or layered thin film structure 134, wherein opening 135 is formed in polysilicon top electrode 125 and structure 134 prior to deposition of second insulator layer 127. Layered resistive memory material of structure 134 can be comprised of individual layers of stoichiometric $SiO_2$, non-stoichiometric silicon oxide, silicon oxides doped with P, B, N, H and C, or any other suitable insulating materials. Those skilled in the art of microfabrication will recognize that the layered resistive memory material of layered thin film structure 134 may be utilized in any of the aforementioned or following implementation discussed.

In FIG. 10C, the resistive memory material is comprised of a single thin film or layered thin film structure 136, wherein an opening is not formed between polysilicon top electrode 125 and doped Si bottom electrode 123. The memresistor is formed in the region defined by the overlap of top electrode 125 and bottom electrode 123, and resistive memory material layer of structure 136 can be comprised of a single layer of a porous silicon oxide. In other implementations, resistive memory material layer 136 can be comprised of a layered structure with individual layers consisting of stoichiometric silicon oxide, non-stoichiometric silicon oxide, silicon oxides doped with P, B, N, H and C, or any other suitable insulating materials. The doping type of adjacent thin film layers may be engineered to form a diode within layer 124 in FIG. 10A, layer 134 in FIG. 10B or layer 136 in FIG. 10C. For example, a diode may be formed by using a two-layered thin film structure comprised of P-doped silicon oxide (phosphosilicate glass) and B-doped silicon oxide (borosilicate glass).

Figure 11:
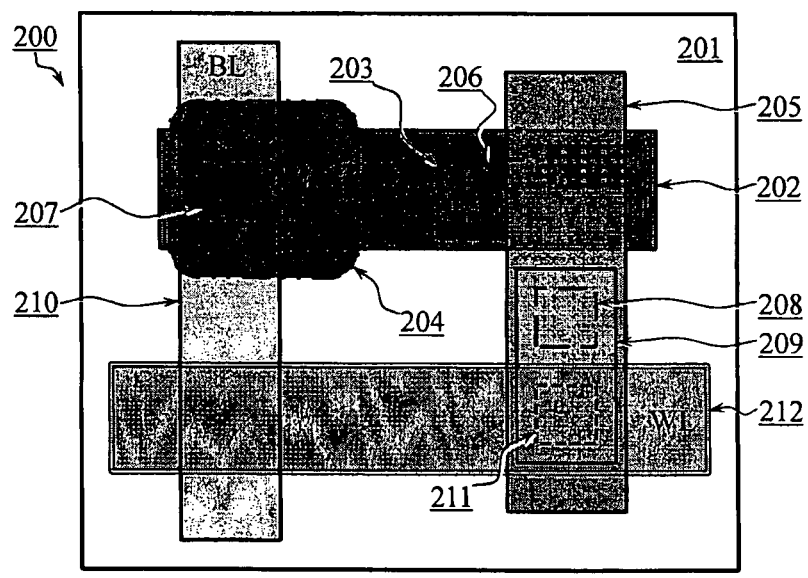
FIG. 11 is an illustrative implementation of a top-down view of a memresistor cell having a diode.

FIG. 11 is an illustrative implementation of a top-down view of a memresistor cell 200 having a diode. Area 204 represents a doped silicon region forming the diode. Substrate 201 may be an un-doped or lightly-doped silicon wafer, or a silicon-on-insulator (SOI) substrate comprised of a single crystal silicon layer on a buried oxide (BOX) layer on a silicon wafer. Single-crystal Si trace 202 is formed on substrate 201, followed by doping Si trace 202 through an opening for bottom electrode 203. Silicon trace 202 is further doped through an opening in area 204 with the opposite doping type to form a pn diode within trace 202. A first insulator layer of silicon oxide and a poly-silicon layer are deposited, and the poly-silicon layer is doped and patterned to form poly-silicon top electrode 205. Region 206 defines the active memresistor region and represents an opening where the first insulator layer is removed to form a sidewall connecting doped single-crystal Si bottom electrode 203 to doped poly-silicon top electrode 205. Opening 206 can be located at any overlap of a top electrode 205 edge and underlying bottom electrode 203. A second insulator layer is then deposited. Openings 207 and 208 are formed in the dielectric, and a first conductive layer is deposited, patterned and etched to form BL trace 210 connected through opening 207 to diode region of area 204, which is already connected through trace 202 to bottom electrode 203. Trace 209 is connected through opening 208 to top electrode 205. A third dielectric is deposited and opening 211 is formed, followed by deposition, pattern and etch of a second conductive layer to form WL trace 212 running orthogonal to BL trace 210. The area defined by opening 206 where an edge of top electrode 205 overlays bottom electrode 203 is the active portion of the memresistor cell. The lower conductive BL trace 210 is defined as the bit line (BL) and the upper conductive WL trace 212 is defined as the word line (WL). Although the bit and word lines are defined to have lower and upper positions the actual position of the bit and word lines can vary in different implementations. The resistive memory material layer has the upper surface connected to one word line trace and the lower surface connected to one terminal of a diode, with the opposing terminal of the diode being connected to one bit line trace in a 2-terminal memresistor cell.

Figure 12:
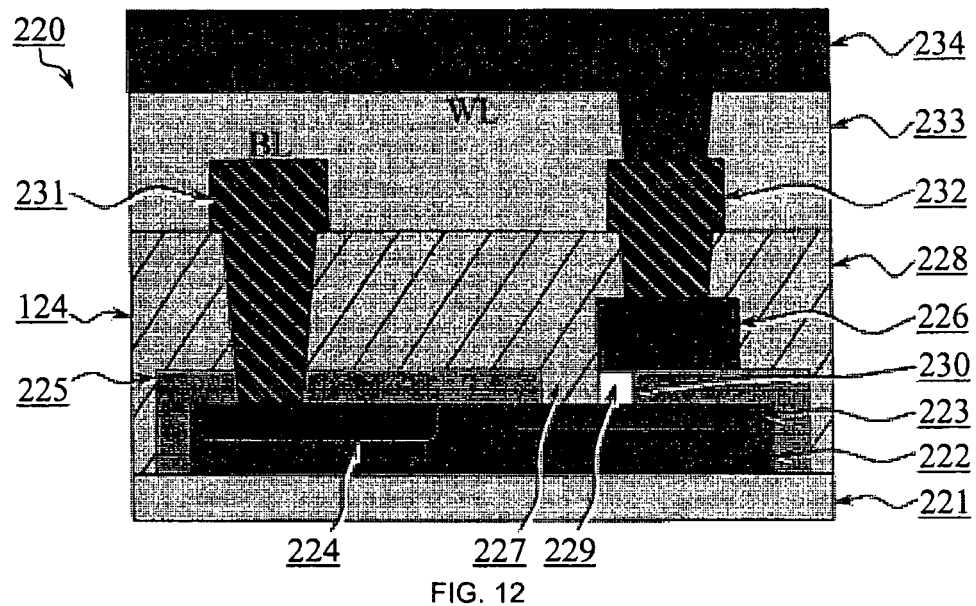
FIG. 12 is an illustrative implementation of a cross-section of a memresistor cell having a diode.

FIG. 12 is an illustrative implementation of a cross-section of a memresistor cell 220 having a diode. Lightly-doped or un-doped region 222 is formed on substrate 221, and bottom electrode 223 is formed by implantation or diffusion of a dopant element into region 222. Doped area of bottom electrode 223 is made p-type by using dopant elements from the group B and In, or doped area bottom electrode 223 is made n-type by using dopant elements from the group P, As, Sb. The doped region of bottom electrode 223 may be the same doping type as the lightly doped region 222. Diode region 224 is formed by implantation, and the doping type is opposite that of bottom electrode 223 and region 222. Bottom electrode 223 electrically connects one side of the device formed in sidewall 230 to lightly doped or undoped region 222, region 222 being connected to diode region 224 which is connected to BL trace 231. The substrate can be semiconducting materials other than Si, such as GaAs, and for these semiconductors the dopants for p and n type regions will change to those appropriate for the semiconductor used. In other implementations, microelectronic components, such as diodes, resistors, capacitors, photodiodes, and/or the like, may be inserted between diode region 224 and bottom electrode 223 to implement a desired circuit function. A first insulating layer 225 is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, and/or any other suitable insulating materials. The insulating materials can be deposited using physical vapor deposition, reactive sputter deposition, low pressure chemical vapor deposition, and plasma enhanced chemical vapor deposition, and/or the like. Poly-silicon is then deposited and doped, spin-coated with photoresist, lithographically patterned, and etched using $SF_6$ plasma processes to form top electrode 226. The photoresist is removed and a next photoresist is spun on the surface and patterned to have openings over regions of the polysilicon edge where top electrode 226 edge overlaps bottom electrode 223. Plasma etching using fluorine containing gases such as $SF_6$ or HF acid wet chemical etching is done to isotropically remove first insulator 225 from selected regions of bottom electrode 223 forming opening 227. After patterning openings in the first insulator layer the photoresist is removed. A second insulating layer 228 is deposited using PECVD or, because only silicon and silicon oxide are present in device, other higher-temperature deposition processes, including low pressure chemical vapor deposition (LPCVD), can be used to form layer 228. In other implementations, thermal oxidation may be performed prior to deposition of layer 228 to form a thin coating of silicon dioxide only on the exposed silicon regions bottom and top electrodes 223, 226 inside opening 227 to passivate the device electrodes with a high-quality, silicon-to-silicon dioxide interface. The second insulating layer 228 is deposited on the surface and may be chemically mechanically polished to make insulating layer 228 planar such that the upper surface of layer 228 is substantially parallel to the substrate. The second insulating layer 228 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any other suitable insulating materials. The second insulation layer 228 may be spin-coated or deposited using physical vapor deposition, reactive sputter deposition, or using silane or tetraethyl orthosilicate (TEOS) based chemistries in a plasma enhanced chemical vapor deposition (PECVD) process, and/or the like. The pressure, power and gas flow parameters of the PECVD process used for layer 228 deposition are tuned to form cavity 229 in a manner so that sidewall 230 is left uncoated and there remains a sealed cavity 229 with a space between sidewall 230 and second insulating layer 228. Thermal anneal in ambients including, but not limited to, vacuum, Ar, $N_2$, $O_2$, $H_2O$ and $H_2/N_2$ may be used to condition sidewall 230 for later electroforming processes, with anneal temperature limited only by the silicon and silicon oxide materials system present at this point in the fabrication sequence. The second insulating layer has holes patterned through it and the first insulating layer using similar photolithography processes used to pattern the first insulator layer and reactive ion etch. The reactive ion etch plasma chemistry includes but is not limited to $CF_xH_y$, and $SF_6$ to stop the etch when the etch front reaches top electrode 226 and diode region 224 so that a high etch selectivity to Si is achieved. BL trace 231 is formed by depositing a first conductive layer on the patterned surface of the second insulation layer 228 and in the openings of first insulating layer 225 to make contact to diode region 224, whereas simultaneously plug 232 is formed making contact to top electrode 226. Third insulating layer 233 is deposited, planarized, patterned and etched using similar methods as described above to form an opening over plug 232, and a second conductive layer is deposited, patterned and etched to form WL trace 234 orthogonal to BL trace 231.

The memresistor cell described in FIG. 11 and FIG. 12 includes a diode formed in the Si substrate by n and p-type areas in contact, a first bit line connected to one terminal of the diode, the other terminal of the diode being connected to the lower surface of the resistive memory material, and a poly-silicon electrode in contact with the upper surface of the resistive memory material and a first word line. Diode region 224 can overlap or contact bottom electrode 223 and still form a diode as long as the doping type is different in each region. As shown in FIG. 12, doped diode region 224 and doped bottom electrode 223 can be separated by a portion of lightly-doped Si trace 222 to form an n+/n/p+ diode, where the Si trace 222 is the n-type doped region and the n+ doped region is bottom electrode 223. A positive voltage on the bit line will result in current flowing through the diode to the resistive memory material and, depending on the programmed resistance value of the resistive material, will pass a current to the word line. Sensing circuits (not shown) may be connected to the word line to measure the current. The diode blocks current flow when the bias across the device is reversed so that current can only flow in one direction through the memresistor cell.

Figure 13:
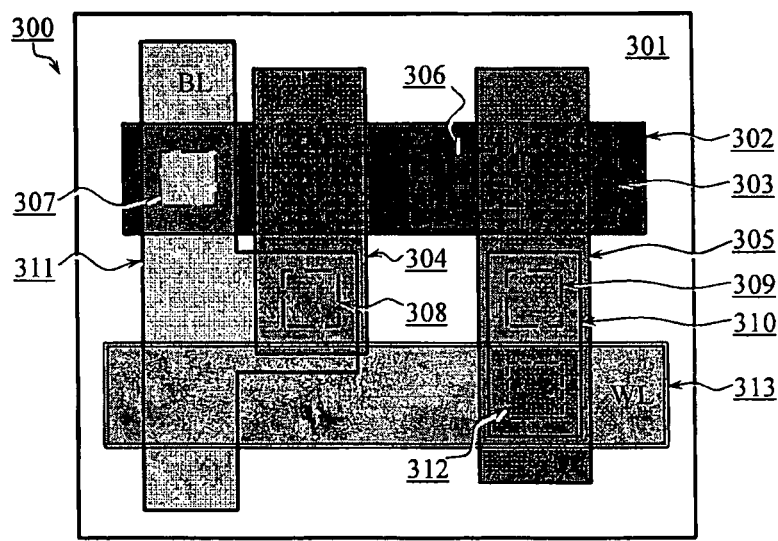
FIG. 13 is an illustrative implementation of a top down view of a memresistor cell having a transistor.

FIG. 13 is an illustrative implementation of a top down view of a memresistor cell 300 having a transistor. Substrate 301 may be an un-doped or lightly-doped silicon wafer, or a silicon-on-insulator (SOI) substrate comprised of a single crystal silicon layer on a buried oxide (BOX) layer on a silicon wafer. Single-crystal Si trace 302 is formed on substrate 301, followed by doping Si trace 302 through opening 303. A first insulator layer and a poly-silicon layer are deposited, and the poly-silicon layer is doped and patterned to simultaneously form transistor poly-silicon gate electrode 304 and memresistor top electrode 305. Conventional transistor processing may be performed, such as ion implantation to dope the Si regions 302 not covered by gate electrode 304 and memresistor top electrode 305, dielectric deposition and etch to form a sidewall dielectric spacer around the periphery of gate electrode 304 and memresistor top electrode 305, additional ion implantation steps to achieve the desired doping levels in the transistor source and drain regions, and metal silicide formation to increase conductivity of exposed Si regions using Pt, Ti, Co, Ni, W, Mo or Ta silicides. Region 306 defines the active memresistor region and represents an opening where the spacer and first insulator layer are removed to form a sidewall connecting bottom electrode 303 to top electrode 305. Region 306 can be located at any overlap of top electrode 305 edge and underlying bottom electrode 303. A second insulator layer is then deposited. Openings 307, 308 and 309 are formed in the second insulator layer, and a first conductive layer is deposited, patterned and etched to form BL trace 311 and trace 310. BL trace 311 is connected through opening 307 to the transistor drain region, transistor drain region being connected through trace 302 to the transistor source region coincident with bottom electrode 303. BL trace 311 is also connected through opening 308 to transistor gate 304 so that the transistor drain region and transistor gate are short circuited and the transistor implements a diode function. In other implementations, the transistor gate may be connected to other circuit elements as needed to implement a desired electrical circuit function. Trace 310 is connected through opening 309 to top electrode 305. A third insulator layer is deposited and opening 312 is formed, followed by deposition, pattern and etch of a second conductive layer to form WL trace 313 running orthogonal to BL 311. The area defined by region 306 where an edge of top electrode 305 overlays bottom electrode 303 is the active portion of the memresistor cell. The lower conductive trace 311 is defined as the bit line (BL) and the upper conductive trace 313 the word line (WL). Although the bit and word lines are defined to have lower and upper positions the actual position of the bit and word lines can vary in other implementations. The resistive memory material layer has the upper surface connected to one word line trace and the lower surface connected to the transistor source region formed in trace 302. When gate electrode 304 is activated by a bias voltage placed on BL 311, electron flow from the transistor source to the transistor drain can occur and the memresistor device current is measured at WL 313. The 2-terminal memresistor may be integrated directly with the transistor since the transistor source region is formed in the same silicon region as the bottom electrode 303 of the memresistor cell 300.

Figure 14:
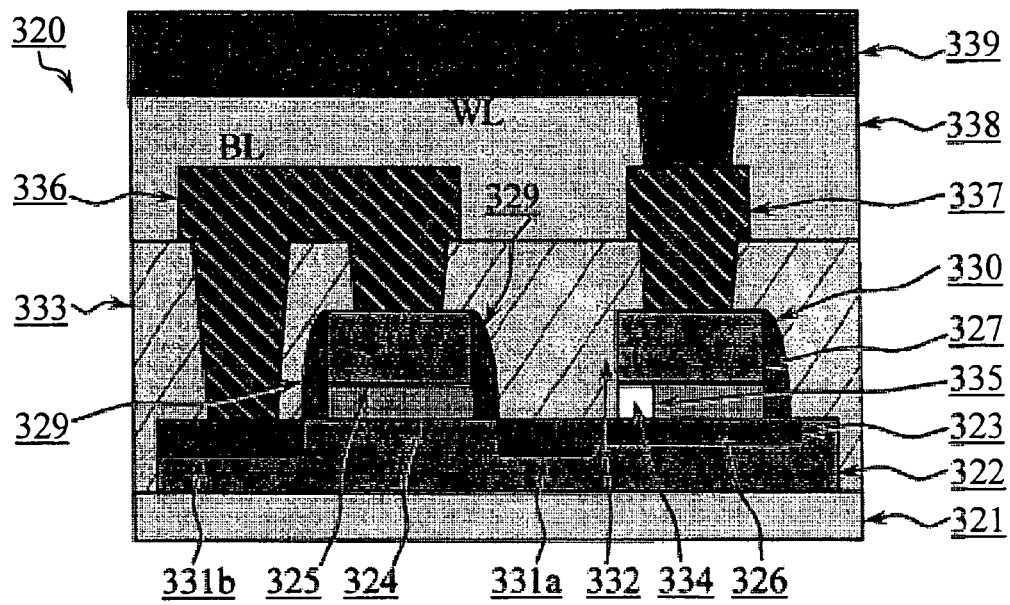
FIG. 14 is an illustrative implementation of a cross-section of a memresistor cell having a transistor.

FIG. 14 is an illustrative implementation of a cross-section of a memresistor cell 320 having a transistor. Lightly-doped or un-doped region 322 is formed on substrate 321, and bottom electrode 323 of a memresistor is formed by implantation or diffusion of a dopant element into layer 322. Doped area of bottom electrode 323 is made p-type by using dopant elements from the group B and In, or doped area of bottom electrode 323 is made n-type by using dopant elements from the group P, As, Sb. Bottom electrode 323 electrically connects one side of the device formed in sidewall 335 to adjacent transistor source or drain defined by doped region 331a. Note that either the transistor source or drain may be connected to bottom electrode 323 of memresistor cell 320. Doped regions 331a, b may be n type or p type, depending on the transistor type. The substrate can be semiconducting materials other than Si, such as GaAs, and for these semiconductors the dopants for p and n type regions will change to those appropriate for the semiconductor used. In other implementations, microelectronic components, such as diodes, resistors, capacitors, photodiodes, and/or the like, maybe inserted between a transistor source and bottom electrode 323 of the memresistor to implement a desired circuit function. A first insulating layer is deposited on the substrate electrically isolating the active element parts of the substrate. The insulating material may be silicon dioxide grown using thermal oxidation or deposited using physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any suitable deposition process. In other implementations, the insulating materials may include, but are not limited to, phosphosilicate glass (PSG), borosilicate glass (BSG), boro-phoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, or any other suitable insulating materials. The insulating materials can be deposited using physical vapor deposition, reactive sputter deposition, low pressure chemical vapor deposition, and plasma enhanced chemical vapor deposition, and/or the like. Polysilicon is then deposited, doped, spin-coated with photoresist, lithographically patterned, and the first insulator and polysilicon layers are etched using reactive ion etch plasma processes to form transistor gate electrode 325 and transistor gate dielectric 324, while simultaneously forming memresistor top electrode 327 and memresistor active dielectric 326. The first photoresist is removed and semiconductor 322 is implanted in region 328 as needed to properly form the transistor source and drain regions, followed by spacer 329, 330 formation. For example, spacers 329, 330 may be formed by depositing a second insulator, such as silicon nitride, using a conformal deposition process such as low pressure chemical vapor deposition, physical vapor deposition, or plasma enhanced chemical vapor deposition, followed by a blanket reactive ion etch to remove the second insulator from all planar surfaces while leaving the sidewalls of gate electrode 325 of the transistor, top electrode 327 of the memresistor, and first dielectric regions 324, 326 coated with the second insulator. Those skilled in the art of microfabrication will recognize that many processing sequences exist to form transistor spacer dielectrics, and that equivalent spacer dielectrics as described herein could be implemented by other microfabrication methods other than the specific process sequence described herein. After spacer formation additional ion implantation or diffusion processes may be performed to adjust doping concentration in transistor source and drain regions, with region 331 either extending to inside semiconductor region 322 or extending all the way down to substrate layer 321 if desired to provide enhanced electrical isolation. Other processes may be included at this point to finalize transistor fabrication in both conventional fabrication sequences as well more advanced fabrication sequences, such as those forming fin structures 322 include a selective metal silicidation of the exposed polysilicon and silicon regions with no metal silicide being formed on the surface of sidewall spacers 329, 330. This metal silicide can be formed by depositing Pt, Ti, Co, Ni, W, Mo or Ta followed by a thermal treatment to selectively form the silicide only on silicon regions, and will form a thin metal silicide layer (not shown) on top of transistor gate electrode 325, memresistor top electrode 327, and in exposed regions 331. A photoresist is then spun on the surface and patterned to have openings over regions of the gate electrode 327 edge where it overlaps memresistor bottom electrode 323. Portions of spacer 330 are removed using phosphoric acid-containing etchant to form opening 332, and wet chemical etching using HF-based etchant is used to isotropically remove the first insulator layer from selected regions of bottom electrode 323 and forming undercut cavity 334. The photoresist is then removed, and a second insulating layer 333 is deposited. The second insulating layer 333 is chemically and/or mechanically polished to make insulating layer 333 planar such that the upper surface is substantially parallel to the substrate. The second insulating layer 333 may be comprised of silicon dioxide, non-stoichiometric silicon oxide, phosphosilicate glass (PSG), borosilicate glass (BSG), boro-phoshosilicate glass (BPSG), or $SiO_xC_yH_z$, or any other suitable insulating materials. The second insulating layer 333 may be spin-coated or deposited using physical vapor deposition, reactive sputter deposition, or using silane or tetraethyl orthosilicate (TEOS) based chemistries in a plasma enhanced chemical vapor deposition (PECVD) process and/or the like. The pressure, power and gas flow parameters of the plasma enhanced chemical vapor deposition process used for second insulating layer 333 deposition are tuned to form cavity 334 in a manner so that sidewall 335 is left uncoated and there remains a sealed cavity 334 with a space between sidewall 335 and second insulating layer 333. Thermal anneal in ambients including, but not limited to, vacuum, Ar, $N_2$, $O_2$, $H_2O$ and $H_2/N_2$ may be used to condition sidewall 335 for later electroforming processes, with anneal temperature limited only by the silicon, silicon nitride and silicon oxide materials system present at this point in the fabrication sequence. The second insulating layer 333 may have holes patterned through it using plasma-based reactive ion etch. The plasma etch chemistry includes, but is not limited to, $CF_xH_y$ and $SF_6$ to stop the second insulator etch when the etch front reaches memresistor top electrode 327, transistor gate electrode 325, and region 322 so that a high etch selectivity to Si is achieved. BL trace 336 is formed by depositing a first conductive layer on the patterned surface of the second insulation layer 333 to make contact to doped region 331 and gate electrode 325, whereas simultaneously plug 337 is formed making contact to top electrode 327. Third insulating layer 338 may be deposited, planarized, patterned and etched using similar methods as described above to form an opening over plug 337, and a second conductive layer is deposited, patterned and etched to form WL trace 339.

The memresistor cell described in FIG. 13 and FIG. 14 includes a transistor formed in the Si substrate by n and p-type areas in contact, a first bit line connected to the drain terminal of the transistor and the transistor gate, the source terminal of the transistor being connected to the lower surface of the resistive material layer, and a polysilicon electrode in contact with the upper surface of the resistive memory material. The polysilicon electrode also being connected electrically to a first word line. Transistor region 331 can overlap or contact memresistor bottom electrode 323 to form a direct connection between the transistor source and the resistive material layer as long as the doping type is the same in bottom electrode 323 and region 331. In other implementations, microelectronic components, such as diodes, resistors, capacitors, photodiodes, and/or the like, may be inserted between transistor source in region 331 and memresistor bottom electrode 323 to implement a desired circuit function. The transistor is connected in series with the memresistor element to form a two-terminal, diode-protected memresistor cell that can be used in a variety of circuit applications. A positive voltage on the bit line will result in current flowing through the field effect transistor and the resistive memory material and into the word line. The current magnitude flowing through the circuit is determined by the programmed resistivity value of the resistive material and the applied bias. Measurement circuits (not shown) may be used to sense the current and assign a high or low logic state value, or a transimpedance amplifier may be used to convert the memresistor current into an analog voltage.

Figure 15:
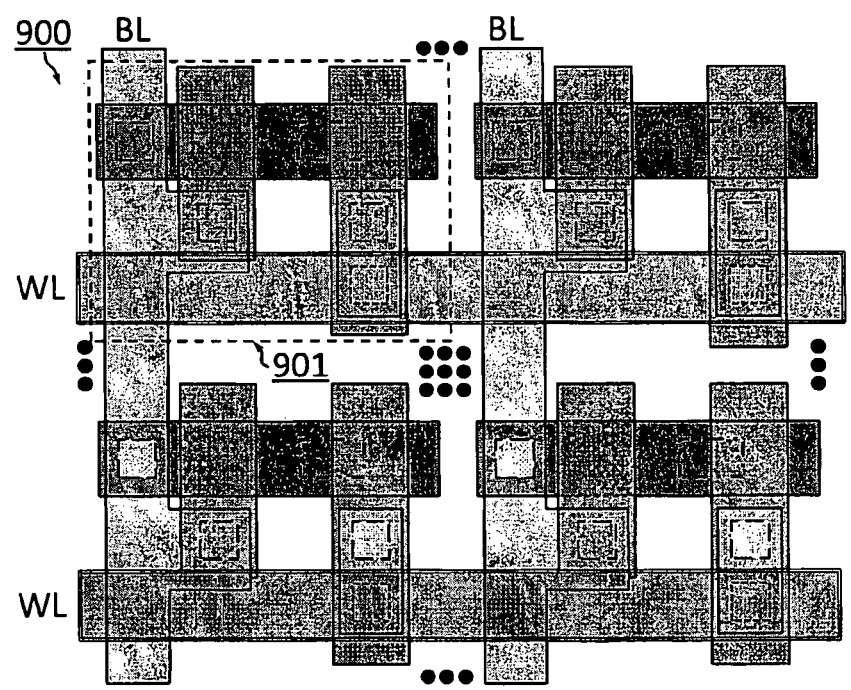
FIG. 15 is an illustrative implementation of a top down view of an array of memresistor cells having a transistor and a collection of any number of orthogonal bit lines and word lines.

FIG. 15 is an illustrative implementation of a top down view of an array 900 of memresistor cells having a transistor and a collection of any number of orthogonal bit lines and word lines. Area 901 representing the area where the memresistor cell is formed between the word WL and bit BL lines. The upper WL conductive trace and lower BL conductive trace are orthogonal and are connected to the two-terminal memresistor cell at each overlap of WL and BL. The lower conductive trace is defined as the bit line and the upper trace the word line. Although the bit and word lines are defined to have lower and upper positions the actual position of the bit and word lines can vary in other implementations. The memresistor cell within the array is accessed by a connection to a unique word and bit lines intersecting at cell locations in the array. The bit line may be connected to both the drain and gate field effect transistor terminals, and the transistor drain terminal may be coincident with the memresistor bottom electrode. The top memresistor electrode may be connected through conductive traces to the word line. Although the memresistor cell shown is a memresistor cell having a transistor, other implementations may provide memresistor cells having other microelectronic components, such as a diode or the like, or may provide memresistor cells having no active device in the memresistor array.

Figure 16:
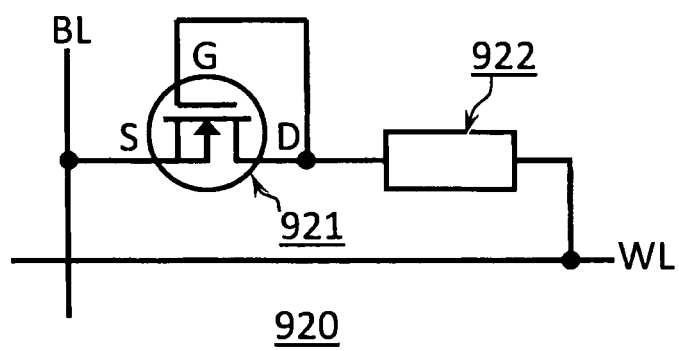
FIG. 16 is an illustrative implementation of a schematic of a memresistor cell having a field effect transistor.

FIG. 16 is an illustrative implementation of a schematic of a memresistor cell having a field effect transistor. The three terminal n channel FET device may be part of the two-terminal, isolated memresistor cell 920 and has the gate and drain terminals of field effect transistor 921 connected together as one terminal. When no voltage is applied to the source of transistor 921 it is in the open condition. When a positive voltage is applied to the source terminal the transistor is closed and current passes between the source and drain. The resistive memory material 922 is connected to the transistor at one terminal and the WL word line at its remaining terminal. When a negative bias is applied to the source terminal, the transistor is open and no current passes between the drain and source, thereby implementing the diode function where current is only able to flow in one direction through memresistor element 922. The n-channel FET transistor is provided in FIG. 16 for purposes of explanation, but it is understood that any suitable type of transistors, such as p-channel FET, n and p channel metal oxide field effect transistors (MOSFET) and bipolar transistors, may be utilized. Further, any suitable type of diode, such as n-p diodes, p-n diodes, Schottky diodes, or the like, could also replace the n channel FET device to implement the same diode function.

In the various implementations discussed above, it will be recognized that numerous variations may be possible. The following discussion may apply to any of the implementations discussed.

Conductive traces, layers, and/or material can be polysilicon or any other conductors, such as, but not limited to, metals, metal silicides, conductive polymers, or the like. The metals can be, but are not limited to, typical metals and metal compounds used in semiconductor devices, such as tungsten, titanium, titanium nitride, platinum silicide, titanium silicide, cobalt silicide, nickel silicide, tungsten silicide, tantalum, tantalum nitride, aluminum, gold, copper, and alloys thereof.

The resistive memory layer may be substantially $SiO_x$, where $1 \leq x \leq 2$. The resistive memory layer may be deposited using thermal oxidation, physical vapor deposition, reactive physical vapor deposition, or using silane or tetraethyl orthosilicate (TEOS) based chemistries in a plasma enhanced chemical vapor deposition (PECVD) process or a low pressure chemical vapor deposition (LPCVD) process, or any other suitable deposition process. In other implementations, the insulating materials may include, but are not limited to, phosphosilicate glass (PSG), borosilicate glass (BSG), borophoshosilicate glass (BPSG), tantalum oxide ($Ta_2O_5$), titanium oxide ($TiO_2$), zirconium oxide ($ZrO_2$), strontium zirconium oxide ($SrZrO_3$), hafnium oxide ($HfO_2$), silicon oxynitrides ($Si_xO_yN_z$), or C-containing, porous oxide materials such as SiOCH, or any other suitable insulating materials. The insulating materials can be deposited using physical vapor deposition, reactive sputter deposition, low pressure chemical vapor deposition, and plasma enhanced chemical vapor deposition and/or the like. The SiOCH resistive memory material may be deposited using plasma enhanced chemical vapor deposition (PECVD) from gaseous growth precursors containing Si, O, C, H, or combinations thereof, to form $SiO_xC_yH_z$, where x is the ratio of O to Si, x being greater than or equal to 0 and less than or equal to 2, and y is the ratio of C to Si, y being in the range from 1 to 0. The SiOCH resistive memory material may also be deposited using spin-coating and thermal curing of solutions containing Si, O, C, H, or combinations thereof, to form $SiO_xC_yH_z$. x is the ratio of O to Si, x being greater than or equal to 0 and less than or equal to 2, and y is the ratio of C to Si, y being in the range from 1 to 0.

The vertical length of resistive memory material between top and bottom electrodes ranges from 1 nm to 200 nm. In some implementations, the vertical length of the resistive memory material is equivalent to the film thickness of the insulator layer in which the resistive memory material is formed.

Conditioning memresistor devices using silicon oxide resistive memory material, also known as electroforming, comprises applying a series of linear voltage ramps or voltage pulses to maximum voltages in the range from 5 to 40V across the bit and word line conductive traces until a characteristic current-voltage (I-V) response is achieved. In one implementation, the conditioning voltage pulse comprises a ramp of voltage from 0 volts to between 20 and 30 volts. Exposure of the vertical device edge to thermal anneal treatments in the range from 200 C to 1000 C prior to applying the electroformation waveforms can reduce the voltage required to initiate electroformation. After several voltage ramps the resistive memory material takes on attributes of a memresistor device.

After the resistive memory material is electroformed, ON and OFF states may be selected by applying a voltage pulse across the word and bit lines. A first voltage pulse range may program a memresistor device into the ON state, and a second voltage pulse range different from the first may program the memresistor device into an OFF state. For example, in some implementations, the high resistance OFF state may be selected by applying a voltage pulse of 5-20 volts with pulsewidth in the range from 10 ns to 1 ms across word and bit lines. The memresistor is programmed to a low resistance ON state by applying 1-4 volts with pulsewidth in the range from 10 ns to 1 ms across word and bit lines. The resistive state of the memresistor cell is read by applying a low bias, such as a voltage in the range from 0.1 to 2 V (typically ~1V), across word and bit lines, and connecting bit or word line to a current measurement circuit comprised of a current sense circuit to determine whether the memresistor cell current is above a threshold current for digital memory applications. In other implementations, the current measurement circuit may be comprised of a transimpedance amplifier to convert the memresistor cell current to an analog voltage for multi-state or analog memory applications. The OFF resistive state has current in the range of $10^{-7}$ amperes or lower at 1 V bias, and the ON state current is in the range of $10^{-3}$ to $10^{-6}$ amperes at 1 V bias. The pulse width, or duration, for programming the silicon oxide memresistor ON and OFF states is between 10 nanoseconds and 1 millisecond. The ON and OFF states are nonvolatile and no electrical power is required to maintain the ON or OFF state.

Modifying either memresistor cell electrode doping concentration and doping type will alter the electrode equilibrium Fermi level and modify the current-voltage response of the memresistor cell. Modifying either memresistor cell electrode material type will alter the electrode work function and modify the current-voltage response of the memresistor cell. As such, it will be recognized by one of ordinary skill in the art that the conditioning voltage and/or read/write voltages may vary in accordance with doping concentration and/or materials utilized in a memresistor device.

Materials modifications, such as using phosphosilicate glass, borosilicate glass, or boro-phoshosilicate glass instead of $SiO_x$, can alter the equilibrium Fermi level within the resistive memory material and modify the voltages at which the ON/OFF state current transitions occur in the current-voltage response. Using a two-layered thin film structure comprised of P-doped silicon oxide (phosphosilicate glass) and B-doped silicon oxide (borosilicate glass) can be used to form a diode within the resistive memory material, thereby allowing electrical current to flow in only one direction through the memresistor cell. Silicon oxide resistive memory material exhibits a current-voltage response where the OFF state current transition occurs at higher voltage than the ON state current transition. Using $Si_xO_yN_z$ with z<y produces a nitrogen-doped silicon oxide with additional electronic states added by the trivalent nitrogen dopant for modification of the voltages at which the ON/OFF state current transitions occur in the current-voltage response. Using hafnium oxide ($HfO_2$) as the resistive memory material can produce either a unipolar or bipolar current-voltage response, whereas the silicon oxide, nitrogen-doped silicon oxides and $SrZrO_3$ resistive memory materials exhibit only a unipolar response. When using $HfO_2$ as the resistive memory material, the current-voltage response is typically bipolar and a voltage of reverse polarity is required to turn the device OFF after turning it ON. The voltage transitions in the current-voltage response will therefore be different than those described above for silicon oxide resistive memory materials, as will the programming voltages and the ON-state and OFF-state read currents. When a sidewall is formed in $Hf_2O$, this material can also exhibit a unipolar I-V response. Using carbon-containing porous silicon oxide materials such as $SiO_xC_yH_z$, or layered silicon oxide/doped silicon oxide thin films provides a method to form the resistive memory material within the bulk of the thin film layer, whereas the resistive memory material is formed at a surface or sidewall edge in non-porous thin film silicon oxide materials.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A resistive memory apparatus comprising:
   a substrate;
   a first electrode formed in a portion of the substrate, wherein the portion of the substrate is doped to form a first doping type area;
   a resistive memory layer positioned over at least a portion of the first electrode, wherein the resistive memory layer provides a low resistivity state when a first predetermined voltage range is applied, and the resistive memory layer provides a high resistivity state when a second predetermined voltage range is applied;
   a second electrode positioned over at least a portion of the resistive memory layer and first electrode, wherein the second electrode is formed from a conductive layer;
   a first trace coupled to the first electrode;

a second trace coupled to the second electrode; and
a diode region formed in a portion of the substrate, wherein a doping type of the diode region is different from the first doping type area of the first electrode, and the second trace is coupled to the diode region.

2. The apparatus of claim 1, wherein the resistive memory layer is $SiO_2$, non-stoichiometric silicon oxide $SiO_x$, a doped silicon oxide, phosphosilicate glass, borosilicate glass, borophosphosilicate glass, tantalum oxide ($Ta_2O_5$), titanium oxide ($TiO_2$), zirconium oxide ($ZrO_2$), strontium zirconium oxide ($SrZrO_3$), $HfO_2$, or a combination thereof.

3. The apparatus of claim 1, wherein the resistive memory layer is $SiO_xC_yH_z$, where $1 \leq x < 2$, $0 \leq y < 2$, and $1 \leq z < 2$.

4. The apparatus of claim 1, wherein the resistive memory layer is $SiO_x$ where $1 \leq x \leq 2$.

5. The apparatus of claim 1, wherein the resistive memory layer is $SiO_xN_y$ where $1 \leq x < 2$ and $1 \leq y < 2$.

6. The apparatus of claim 1, wherein the conductive layer is polysilicon, n-type doped polysilicon, p-type doped polysilicon, tungsten, titanium tungsten alloy, titanium nitride alloy, tantalum, tantalum nitride alloy, aluminum, copper, platinum silicide, titanium silicide, cobalt silicide, nickel silicide, tungsten silicide, or a combination thereof.

7. The apparatus of claim 1, further comprising:
an opening for the first electrode, wherein at least a portion of the first electrode is not covered by the resistive memory layer and the conductive layer.

8. The apparatus of claim 1, further comprising:
a first insulator layer positioned over the resistive memory layer and the second electrode,
wherein the resistive memory layer comprises one or more individual layers.

9. The apparatus of claim 7, further comprising:
a passivated layer covering at least a portion of the first electrode and the second electrode, wherein the passivated layer passivates exposed regions of the first and second electrodes; and
a first sidewall of the resistive memory layer, wherein the first sidewall contacts the first electrode and the second electrode.

10. The apparatus of claim 9, further comprising:
a first insulator layer covering the passivated layer, wherein a cavity is provided between the first insulator layer and the resistive memory layer; and
a first sidewall of the first insulator layer, wherein the first sidewall of the first insulator layer contacts the passivated layer on the first electrode and the passivated layer on the second electrode.

11. The apparatus of claim 10, wherein the first insulator layer is $SiO_2$, non-stoichiometric silicon oxide $SiO_x$ where $1 \leq x < 2$, phosphosilicate glass, borosilicate glass, boro-phosphosilicate glass, $SiO_xC_yH_z$ where $1 \leq x < 2$, $0 \leq y < 2$, and $1 \leq z < 2$, or a combination thereof.

12. The apparatus of claim 7, wherein a passivated layer is $SiO_2$.

13. The apparatus of claim 7, further comprising:
a first insulator layer covering at least a portion of the resistive memory layer and the conductive layer, wherein the first insulator layer encapsulates the opening to form a cavity; and
a first sidewall of the resistive memory layer, wherein the first sidewall contacts the first electrode and the second electrode.

14. The apparatus of claim 13, where in the first insulator layer is $SiO_2$, non-stoichiometric silicon oxide SiO, where $1 \leq x < 2$, phosphosilicate glass, borosilicate glass, boro-phosphosilicate glass, $SiO_xC_yH_z$ where $1 \leq x < 2$, $0 \leq y < 2$, and $1 \leq z < 2$, or a combination thereof.

15. The apparatus of claim 13, further comprising:
a first sidewall of the first insulator layer, wherein the first sidewall of the first insulator layer contacts the first electrode and the second electrode.

16. The apparatus of claim 13, further comprising:
a second insulating layer covering the first insulating layer;
a first sidewall of the first insulator layer, wherein the first sidewall of the first insulator layer contacts the first electrode and the second electrode.

17. The apparatus of claim 16, further comprising:
a passivated layer covering at least a portion of the second electrode, wherein the passivated layer passivates exposed regions of the second electrodes.

18. The apparatus of claim 1, further comprising:
a first insulator layer covering at least a portion of the resistive memory layer and the conductive layer, wherein the first insulator layer encapsulates the opening to form a cavity; and
a second insulating layer covering the first insulating layer;
a first sidewall of the resistive memory layer, wherein the first sidewall contacts the first electrode and the second electrode.

19. The apparatus of claim 7, further comprising:
a first insulator layer covering at least a portion of the resistive memory layer and the conductive layer, wherein the first insulator layer does not cover the opening for the first electrode;
a second insulator layer disposed on the first insulator layer, wherein the second insulator layer comprises layers of one or more insulators, and the second insulator layer does not cover the opening for the first electrode;
a first sidewall of the resistive memory layer, wherein the first sidewall contacts the first electrode and the second electrode; and
a cover layer covering the opening to form a cavity, wherein the cover layer overlays the opening and the second insulator layer.

20. The apparatus of claim 19, wherein the first insulator layer is $SiO_2$, non-stoichiometric silicon oxide SiO, where $1 \leq x < 2$, phosphosilicate glass, borosilicate glass, boro-phosphosilicate glass, $SiO_xC_yH_z$ where $1 \leq x < 2$, $0 \leq y < 2$, and $1 \leq z < 2$, or a combination thereof.

21. The apparatus of claim 19, wherein the second insulator layer comprises a plurality of layers of insulating materials.

22. The apparatus of claim 19, wherein the cover layer is a wafer.

23. The apparatus of claim 7, further comprising:
a first insulator layer covering at least a portion of the resistive memory layer and the conductive layer, wherein the first insulator layer fills the opening for the first electrode; and
a first sidewall of the resistive memory layer, wherein the first sidewall contacts the first electrode and the second electrode.

24. The apparatus of claim 23, where in the first insulator layer is $SiO_2$, non-stoichiometric silicon oxide SiO, where $1 \leq x < 2$, phosphosilicate glass, borosilicate glass, boro-phosphosilicate glass, $SiO_xC_yH_z$ where $1 \leq x < 2$, $0 \leq y < 2$, and $1 \leq z < 2$, or a combination thereof.

25. The apparatus of claim 23, wherein the resistive memory layer comprises multiple layers.

26. The apparatus of claim 25, wherein the resistive memory layer comprises layers of $SiO_2$; non-stoichiometric silicon oxide ($SiO_x$) where $1 \leq x < 2$; silicon oxide doped with P, B, N, H, or C; or a combination thereof.

27. The apparatus of claim 7, further comprising:
a first transistor region in the substrate, wherein the first transistor region is coupled to the second trace;
a second transistor region in the substrate, wherein the second transistor region is doped to the first doping type; and the second transistor region overlaps with the first doping type area;
a gate dielectric layer positioned on the substrate, wherein the gate dielectric layer is position over at least a portion of the first and second transistor regions;
a transistor gate electrode positioned on the gate dielectric layer; and
a first insulator layer covering at least a portion of the resistive memory layer and the conductive layer, wherein the first insulator layer encapsulates the opening to form a cavity; and
a first sidewall of the resistive memory layer, wherein the first sidewall contacts the first electrode and the second electrode.

28. The apparatus of claim 27, further comprising a second insulating layer covering the first insulating layer.

* * * * *